US012635571B2

(12) United States Patent
Ju et al.

(10) Patent No.: US 12,635,571 B2
(45) Date of Patent: May 19, 2026

(54) DISPLAY DEVICE INCLUDING REPAIRED DEFECTIVE SUB-PIXEL

(71) Applicant: LG Display Co., Ltd., Seoul (KR)

(72) Inventors: SeongHwan Ju, Paju-si (KR); Youngchor Cho, Paju-si (KR); Hanchul Park, Goyang-si (KR); Jinho Cho, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 738 days.

(21) Appl. No.: 17/985,656

(22) Filed: Nov. 11, 2022

(65) Prior Publication Data

US 2023/0178532 A1     Jun. 8, 2023

(30) Foreign Application Priority Data

Dec. 2, 2021     (KR) ......................... 10-2021-0171291

(51) Int. Cl.
H10W 90/00     (2026.01)
H10H 20/856     (2025.01)
H10H 20/857     (2025.01)

(52) U.S. Cl.
CPC .......... H10W 90/00 (2026.01); H10H 20/856 (2025.01); H10H 20/857 (2025.01)

(58) Field of Classification Search
CPC . H01L 25/167; H01L 25/0753; H10H 20/856; H10H 20/857; H10H 20/01;

(Continued)

(56) References Cited

U.S. PATENT DOCUMENTS 9,129,923 B1     9/2015 Han et al.
9,240,397 B2     1/2016 Bibl et al.
(Continued)

FOREIGN PATENT DOCUMENTS

CN     105097867 A     11/2015
CN     112530996 A     3/2021
(Continued)

OTHER PUBLICATIONS

Office Action dated Aug. 23, 2023 issued in corresponding the Taiwanese Patent Application No. 111140721.
(Continued)

*Primary Examiner* — Mohammad M Hoque
(74) *Attorney, Agent, or Firm* — Morgan, Lewis & Bockius LLP

(57) ABSTRACT
A display device includes a substrate on which a plurality of sub-pixels including at least one defective sub-pixel are defined; a light emitting element disposed in each of the sub-pixels; a driving transistor disposed in each of the sub-pixels and having a source electrode connected to a cathode of the light emitting element; a capacitor disposed in each of the sub-pixels and connected between a gate electrode and the source electrode of the driving transistor; and a reflector disposed in each of the sub-pixels and electrically connected to the cathode. In the defective sub-pixel, the gate electrode and the source electrode of the driving transistor are electrically connected through the capacitor. Accordingly, according to the present disclosure, the defective sub-pixel can be easily darkened or blackened by performing a welding process on a capacitor including a plurality of electrodes spaced apart from each other in the defective sub-pixel.

20 Claims, 11 Drawing Sheets

(58) Field of Classification Search
CPC .......... H10K 59/1213; H10K 59/1216; H10K
59/122; H10K 2102/3026; H10K 59/123;
H10K 71/861; H10K 59/131; H10D
86/40
USPC .......................................................... 257/71
See application file for complete search history.

(56) References Cited

U.S. PATENT DOCUMENTS

| | | | |
|---|---|---|---|
| 2002/0014851 A1* | 2/2002 | Tai ......................... G09G 3/006 315/169.3 | |
| 2007/0194313 A1 | 8/2007 | Jung | |
| 2014/0246675 A1 | 9/2014 | Imamura et al. | |
| 2014/0326969 A1 | 11/2014 | Kim | |
| 2018/0122888 A1* | 5/2018 | Jung .................. H10K 59/1213 | |
| 2021/0091159 A1* | 3/2021 | Lee ...................... H10K 59/126 | |
| 2021/0202631 A1 | 7/2021 | Jo et al. | |
| 2021/0202661 A1 | 7/2021 | Kim et al. | |
| 2021/0305352 A1 | 9/2021 | Kim et al. | |

FOREIGN PATENT DOCUMENTS

| | | |
|---|---|---|
| EP | 3846219 A1 | 7/2021 |
| KR | 10-2009-0014484 A | 2/2009 |
| KR | 10-2014-0131637 A | 11/2014 |
| KR | 10-2019-0072217 A | 6/2019 |
| KR | 10-2021-0086049 A | 7/2021 |
| TW | I585996 B | 6/2017 |
| WO | 2013/046606 A1 | 4/2013 |

OTHER PUBLICATIONS

Extended European Search Report dated Mar. 4, 2023, issued in corresponding European Patent Application No. 22204078.4.
Office Action dated Sep. 10, 2025, issued in corresponding Korean Patent Application No. 10-2021-0171291 (with machine translation).

* cited by examiner

PC(T1,T2,T3,T4,T5,T6,T7,C1,C2,C3)

DISPLAY DEVICE INCLUDING REPAIRED DEFECTIVE SUB-PIXEL

CROSS-REFERENCE TO RELATED APPLICATIONS

This application claims the benefit of and priority to Korean Patent Application No. 10-2021-0171291 filed on Dec. 2, 2021, in the Republic of Korea, the entire contents of which are hereby expressly incorporated by reference into the present application.

BACKGROUND

Technical Field

The present disclosure relates to a display device, and more particularly, to a display device capable of darkening and/or repairing defective sub-pixels through a simplified welding process.

Discussion of the Related Art

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices, and thus, display devices having a reduced volume and weight while having a wide active area are being studied.

In recent years, display devices including light emitting diodes (LEDs) have received attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high-brightness image.

SUMMARY

Accordingly, embodiments of the present disclosure are directed to a display device that substantially obviates one or more of the problems due to limitations and disadvantages of the related art.

An aspect of the present disclosure is to provide a display device capable of easily preventing a bright spot defect in a defective sub-pixel.

Another aspect of the present disclosure is to provide a display device capable of preventing abnormal driving in a defective sub-pixel through only a single welding process.

Still another aspect of the present disclosure is to provide a display device capable of connecting a light emitting element of a defective sub-pixel to a pixel circuit of a normal sub-pixel through only a single welding process.

Still another aspect of the present disclosure is to provide a display device capable of easily connecting a light emitting element connected to a defective pixel circuit to a pixel circuit that normally drives by using a reflector.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate on which a plurality of sub-pixels including at least one defective sub-pixel are defined, a light emitting element disposed in each of the plurality of sub-pixels, a driving transistor disposed in each of the plurality of sub-pixels and having a source electrode connected to a cathode of the light emitting element, a capacitor disposed in each of the plurality of sub-pixels and connected between a gate electrode and the source electrode of the driving transistor, and a reflector disposed in each of the plurality of sub-pixels and electrically connected to the cathode. In the defective sub-pixel, the gate electrode and the source electrode of the driving transistor are electrically connected through the capacitor. Accordingly, according to the present disclosure, the defective sub-pixel can be easily darkened or blackened by performing a welding process on a capacitor including a plurality of electrodes spaced apart from each other in the defective sub-pixel.

In another aspect, a display device comprises a substrate on which a defective sub-pixel and a normal sub-pixel adjacent to the defective sub-pixel are defined, a light emitting element disposed in each of the defective sub-pixel and the normal sub-pixel, a driving transistor disposed in each of the defective sub-pixel and the normal sub-pixel and including a source electrode electrically connected to a cathode of the light emitting element, a capacitor disposed in each of the defective sub-pixel and the normal sub-pixel and including a plurality of capacitor electrodes that are connected to each of a gate electrode and the source electrode of the driving transistor, and a reflector disposed between the driving transistor and the light emitting element and electrically connected to the cathode in each of the defective sub-pixel and the normal sub-pixel. The reflector of the defective sub-pixel and the reflector of the normal sub-pixel are electrically connected. Accordingly, according to the present disclosure, the defective sub-pixel can be repaired by connecting the reflector of the defective sub-pixel and the reflector of the normal sub-pixel, and the light emitting element of the defective sub-pixel can be driven by the driving transistor of the normal sub-pixel.

Other detailed matters of the embodiments are included in the detailed description and the drawings.

According to the present disclosure, a defective sub-pixel can be deactivated and a repair process may be conducted through only two welding processes.

According to the present disclosure, a defective pixel circuit can be blackened or darkened by performing a welding process on a capacitor connected to a driving transistor.

According to the present disclosure, a light emitting element of a defective sub-pixel can be easily connected to a pixel circuit of a normal sub-pixel by using a reflector.

According to the present disclosure, since a repair process is performed using a reflector and a capacitor without a separate structure for only the repair process, a structure of the display device can be simplified.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
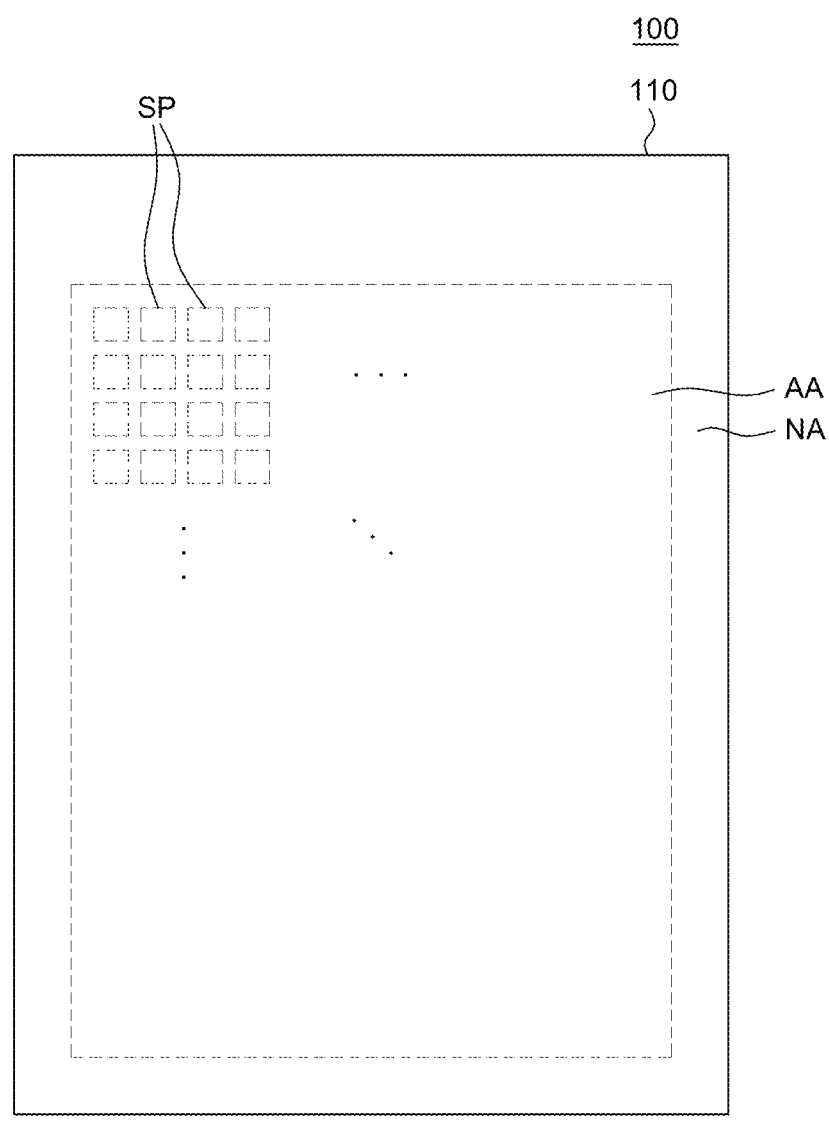
FIG. 1 is a schematic plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

FIG. 1 is a schematic plan view of a display device according to an embodiment of the present disclosure. In FIG. 1, only a substrate 110 and a plurality of sub-pixels SP among various components of a display device 100 are illustrated for convenience of explanation.

The substrate 110 is a component to support various components included in the display device 100 and may be formed of an insulating material. For example, the substrate 110 may be formed of glass or resin or the like. Also, the substrate 110 may be formed to include a polymer or plastic, and may be formed of a material having flexibility.

The substrate 110 includes an active area AA and a non-active area NA.

The active area AA is an area in which the plurality of sub-pixels SP are disposed to display an image. Each of the plurality of sub-pixels SP is an individual unit emitting light, and a light emitting element and a pixel circuit are formed in each of the plurality of sub-pixels SP. For example, the plurality of sub-pixels SP may include a red sub-pixel, a green sub-pixel, a blue sub-pixel, and/or a white sub-pixel, but are not limited thereto.

The non-active area NA is an area in which no image is displayed, and is an area in which various lines, driver ICs, and the like for driving the sub-pixels SP disposed in the active area AA are disposed. For example, various ICs such as a gate driver IC and a data driver IC and the like may be disposed in the non-active area NA. Meanwhile, the non-active area NA may be located on a rear surface of the substrate 110, that is, on a surface without the sub-pixels SP, or may be omitted, and is not limited to those illustrated in drawings.

Figure 2:
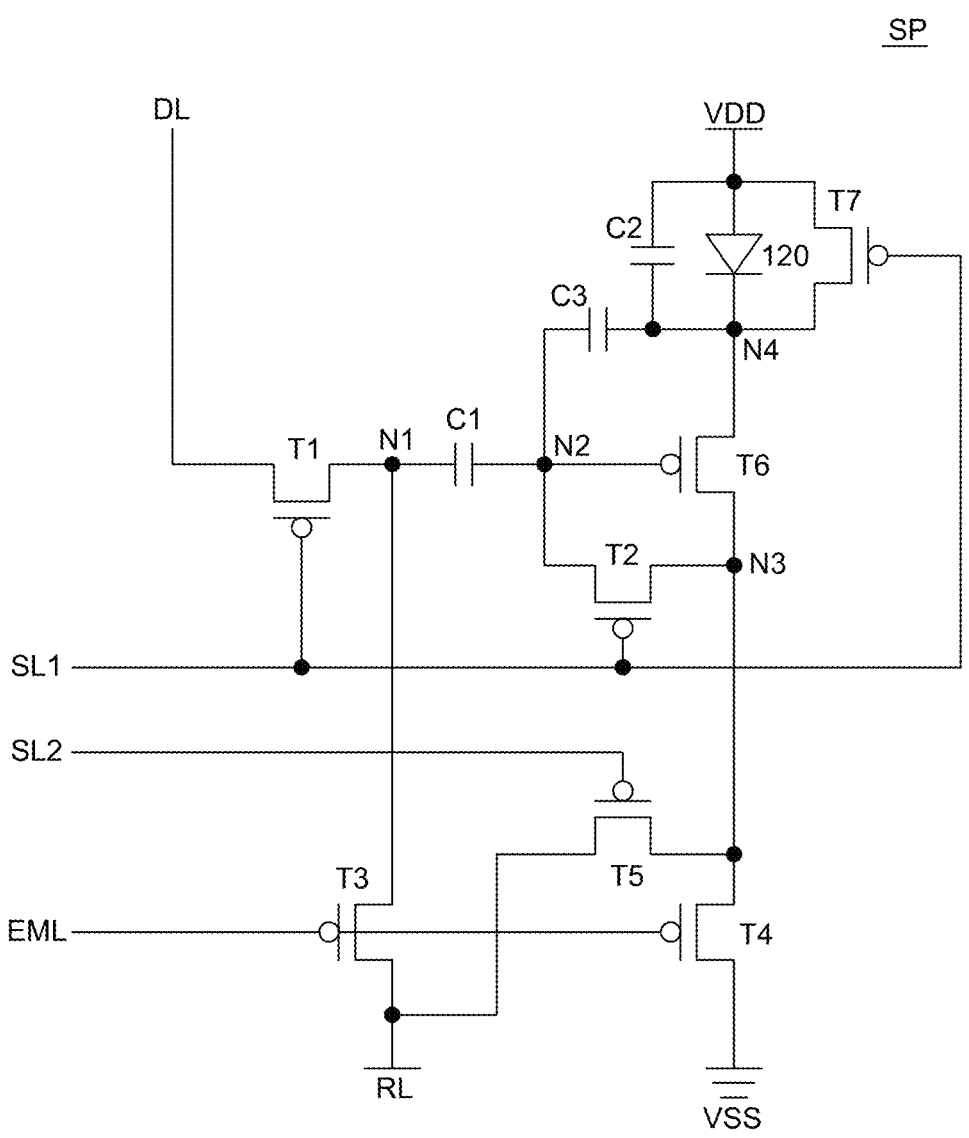
FIG. 2 is a circuit diagram of a pixel circuit of a sub-pixel of the display device according to an embodiment of the present disclosure.

Hereinafter, FIG. 2 is referred together for a more detailed description of the plurality of sub-pixels SP.

FIG. 2 is a circuit diagram of a pixel circuit of a sub-pixel of the display device according to an embodiment of the present disclosure.

Referring to FIG. 2, each of the plurality of sub-pixels SP is connected to a first scan line SL1, a second scan line SL2, a data line DL, an emission control signal line EML, a reference line RL, a high potential power line VDD, and a low potential power line VSS. And, a pixel circuit PC including a first transistor T1, a second transistor T2, a third transistor T3, a fourth transistor T4, a fifth transistor T5, a sixth transistor T6, a seventh transistor T7, a first capacitor C1, a second capacitor C2, and a third capacitor C3, and the light emitting element 120 that is connected to the pixel circuit PC are disposed in each of the plurality of sub-pixels SP.

First, the first transistor T1, the second transistor T2, the third transistor T3, the fourth transistor T4, the fifth transistor T5, the sixth transistor T6, and the seventh transistor T7 of the pixel circuit PC are disposed in each of the plurality of sub-pixels SP. Each of the first transistor T1, the second transistor T2, the third transistor T3, the fourth transistor T4, the fifth transistor T5, the sixth transistor T6, and the seventh transistor T7 includes a gate electrode, a source electrode, and a drain electrode.

The first transistor T1, the second transistor T2, the third transistor T3, the fourth transistor T4, the fifth transistor T5, the sixth transistor T6, and the seventh transistor T7 may be N-type transistors or P-type transistors. In the N-type transistor, since carriers are electrons, the electrons may flow from the source electrode to the drain electrode, and current may flow from the drain electrode to the source electrode. In the P-type transistor, since carriers are holes, the holes may flow from the source electrode to the drain electrode, and current may flow from the source electrode to the drain electrode. For example, one transistor of a plurality of the transistors may be an N-type transistor, and the other transistor of the plurality of transistors may be a P-type transistor. Hereinafter, descriptions are made on the assumption that the first transistor T1, the second transistor T2, the third transistor T3, the fourth transistor T4, the fifth transistor T5, the sixth transistor T6, and the seventh transistor T7 are P-type transistors, but the present disclosure is not limited thereto.

The first transistor T1 includes a first gate electrode, a first source electrode, and a first drain electrode. The first gate electrode is connected to the first scan line SL1, the first source electrode is connected to the data line DL, and the first drain electrode is connected to a first node N1. The first transistor T1 may transmit a data voltage from the data line DL to the first node N1 based on a scan signal of the first scan line SL1.

The second transistor T2 includes a second gate electrode, a second source electrode, and a second drain electrode. The second gate electrode is connected to the first scan line SL1, the second source electrode is connected to a second node N2, and the second drain electrode is connected to a third node N3. The second transistor T2 may short-circuit a sixth gate electrode and a sixth drain electrode of the sixth transistor T6 and may allow for diode-connection of the sixth transistor T6. In the diode connection, the gate electrode and the drain electrode are short-circuited, so that the transistor operates like a diode. In this case, the second transistor T2 is implemented as an oxide semiconductor transistor in which an off-current is low, and thus, leakage of current from the sixth gate electrode of the sixth transistor T6 may be reduced or minimized.

The third transistor T3 includes a third gate electrode, a third source electrode, and a third drain electrode. The third gate electrode is connected to the emission control signal line EML, the third source electrode is connected to the reference line RL, and the third drain electrode is connected to the first node N1. The third transistor T3 may transmit a reference voltage from the reference line RL to the first node N1 based on an emission control signal of the emission control signal line EML, and may allow the second node N2 to maintain a constant voltage while the light emitting element 120 emits light.

The fourth transistor T4 includes a fourth gate electrode, a fourth source electrode, and a fourth drain electrode. The fourth gate electrode is connected to the emission control signal line EML, the fourth source electrode is connected to the third node N3, and the fourth drain electrode is connected to the low potential power line VSS. The fourth transistor T4 may provide a low potential power voltage to the third node N3 based on the emission control signal and allow a driving current to flow.

The fifth transistor T5 includes a fifth gate electrode, a fifth source electrode, and a fifth drain electrode. The fifth gate electrode is connected to the second scan line SL2, the fifth source electrode is connected to the reference line RL, and the fifth drain electrode is connected to the third node N3. The fifth transistor T5 may provide a reference voltage to the third node N3 based on a scan signal of the second scan line SL2, and may reset the third node N3 and the sixth drain electrode of the sixth transistor T6 with the reference voltage.

The sixth transistor T6 includes the sixth gate electrode, a sixth source electrode, and the sixth drain electrode. The sixth gate electrode is connected to the second node N2, the sixth source electrode is connected to a fourth node N4, and the sixth drain electrode is connected to the third node N3. The sixth transistor T6 may be turned on and control the driving current flowing through the light emitting element 120, and may be referred to as a driving transistor.

The seventh transistor T7 includes a seventh gate electrode, a seventh source electrode, and a seventh drain electrode. The seventh gate electrode is connected to the first scan line SL1, the seventh source electrode is connected to the high potential power line VDD, and the seventh drain electrode is connected to the fourth node N4. The seventh source electrode may transmit a high potential power voltage to the fourth node N4 based on a scan signal of the first scan line SL1 and may prevent the light emitting element 120 from emitting light while the data voltage is provided.

The first capacitor C1 includes a capacitor electrode that is connected to the first node N1 and a capacitor electrode that is connected to the second node N2. The first capacitor C1 may adjust a voltage of the second node N2 using a coupling characteristic, and may fix a voltage that is applied to the sixth gate electrode of the sixth transistor T6 while the light emitting element 120 emits light, and maintain the driving current constantly.

The second capacitor C2 includes a capacitor electrode that is connected to the fourth node N4 and a capacitor electrode that is connected to the high potential power line VDD. That is, the second capacitor C2 includes capacitor electrodes that are connected to a cathode and an anode of the light emitting element 120, respectively. The second capacitor C2 may increase capacitance that is inherent in the light emitting element 120, so that light having a higher luminance may be emitted from the light emitting element 120.

The third capacitor C3 includes a capacitor electrode that is connected to the second node N2 and a capacitor electrode that is connected to the fourth node N4. In other words, the third capacitor C3 is connected between the sixth gate electrode and the sixth source electrode of the sixth transistor T6 and between the sixth gate electrode and the cathode of the light emitting element 120.

Meanwhile, when the voltage at the first node N1 is changed, the voltage of the second node N2 may be changed. In this case, the third capacitor C3 that is connected in series with the first capacitor C1 is coupled with the first capacitor C1, and according to a capacitance ratio of the first capacitor C1 and the third capacitor C3, the voltage of the first node N1 may be transferred to the voltage of the second node N2. Accordingly, a transfer rate of the data voltage from the first node N1 to the second node N2 may be reduced by using the third capacitor C3. In addition, when the light emitting element 120 is formed of a micro-LED in which a slope of I-V curve is high, a more delicate gray scale can be expressed by lowering the transfer rate of the data voltage using the third capacitor C3. However, the pixel circuit according to embodiments of the present disclosure is not limited to that shown in FIG. 2, and may also have various structures such as 3T1C, 3T2C, 4T1C, etc.

Hereinafter, structures of sub-pixels SP of the display device 100 according to an embodiment of the present disclosure will be described with reference to FIGS. 3A to 4.

Figure 3A:
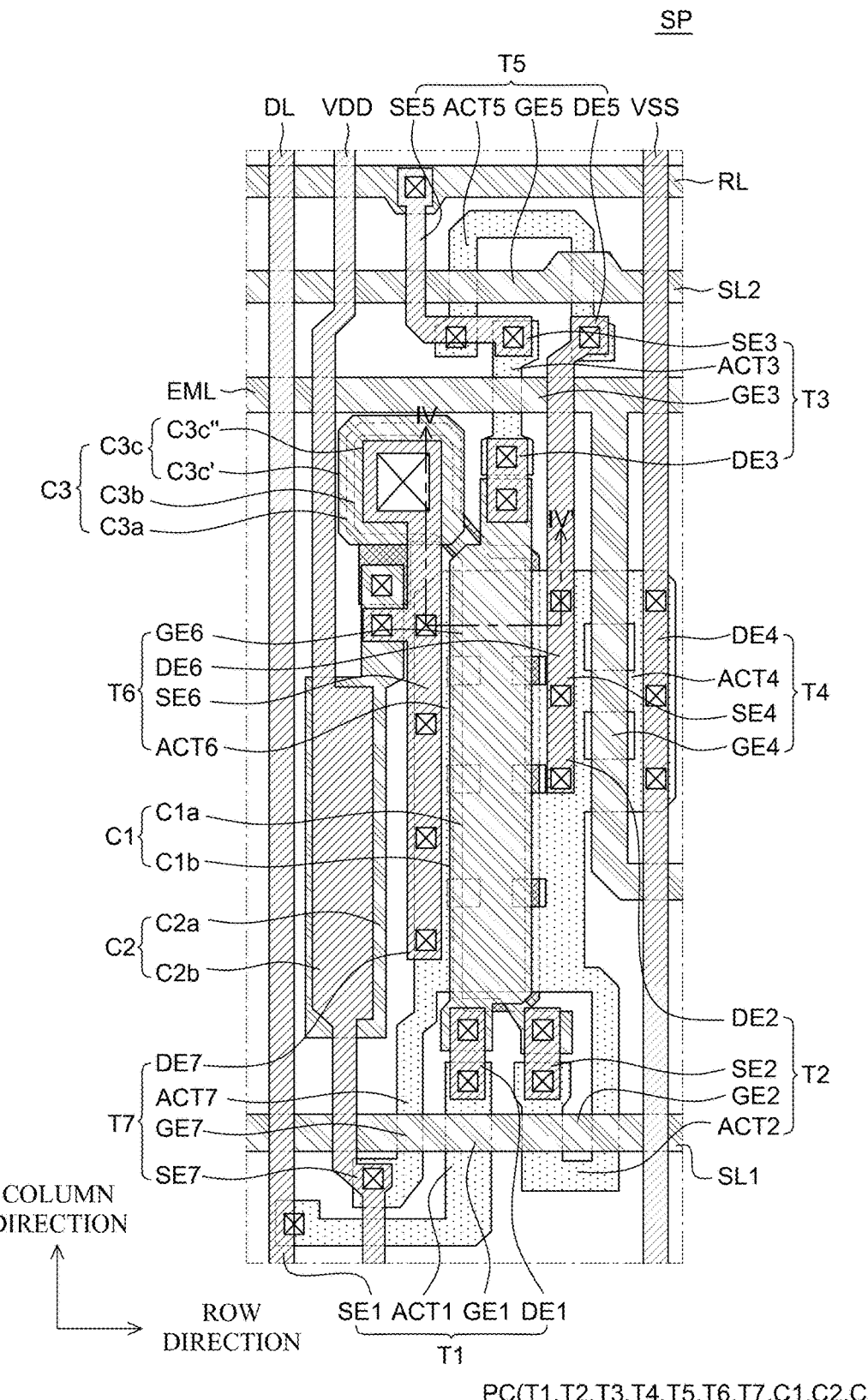
FIGS. 3A and 3B are plan views of sub-pixels of the display device according to an embodiment of the present disclosure.
Figure 3B:
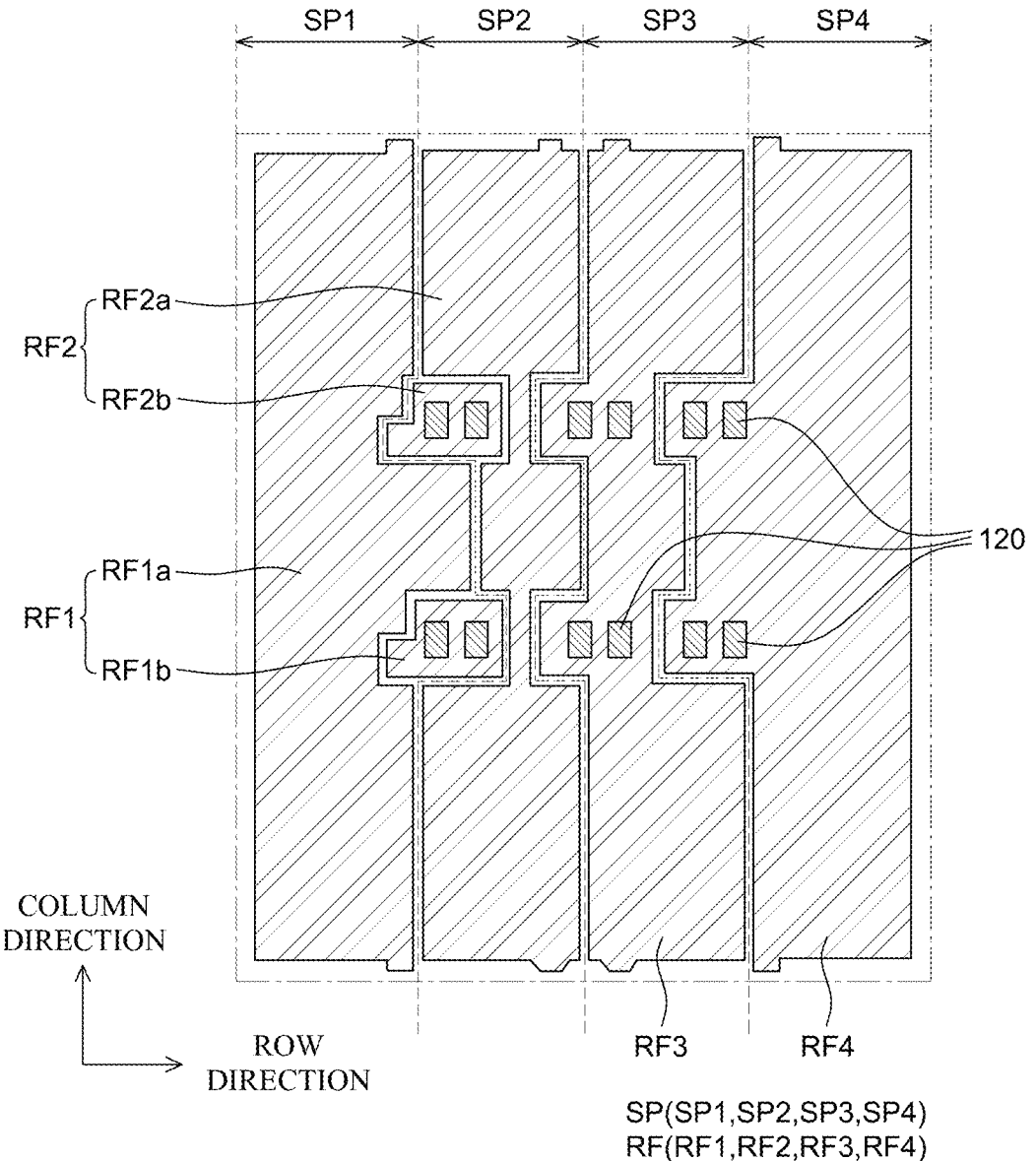

FIGS. 3A and 3B are plan views of sub-pixels of the display device according to an embodiment of the present disclosure. FIG. 4 is a cross-sectional view taken along line IV-IV' of FIG. 3A. FIG. 3A is a plan view of a pixel circuit of a sub-pixel of the display device according to an embodiment of the present disclosure. FIG. 3B is a plan view of reflectors and light emitting elements of a plurality of sub-pixels of the display device according to an embodiment of the present disclosure.

Figure 4:
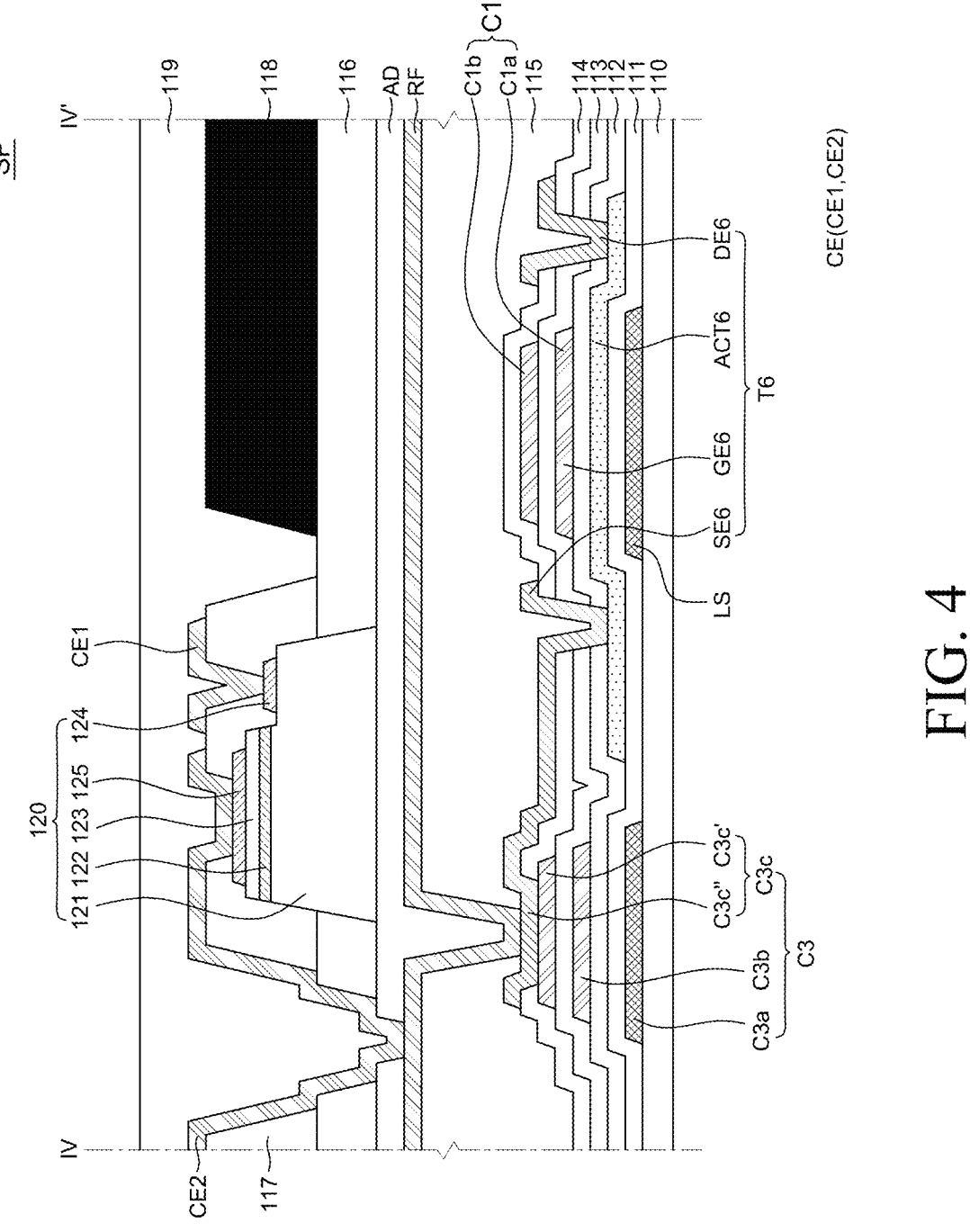
FIG. 4 is a cross-sectional view taken along line IV-IV' of FIG. 3A.

Referring to FIGS. 3A and 4, a light shielding layer LS is disposed on each of the plurality of sub-pixels SP on the substrate 110. The light shielding layer LS may block light incident from a lower portion of the substrate 110 to active layers of a plurality of transistors to thereby reduce or minimize a leakage current. For example, the light shielding layer LS may be disposed under a sixth active layer ACT6 of a sixth transistor T6 that functions as a driving transistor and block light incident to the sixth active layer ACT6. If light is irradiated onto the sixth active layer ACT6, a leakage current may occur, so that reliability of the sixth transistor T6 may be degraded. Accordingly, the reliability of the sixth transistor T6 may be improved by disposing the light shielding layer LS for blocking light on the substrate 110. The light shielding layer LS may be formed of an opaque conductive material, for example, copper (Cu), aluminum (Al), molybdenum (Mo), nickel (Ni), titanium (Ti), chromium (Cr), or an alloy thereof, but is not limited thereto.

A buffer layer 111 is disposed on the light shielding layer LS. The buffer layer 111 may reduce penetration of moisture or impurities through the substrate 110. The buffer layer 111 may be formed of, for example, a single layer or multilayers of silicon oxide (SiOx) or silicon nitride (SiNx), but is not limited thereto. However, the buffer layer 111 may be omitted depending on a type of the substrate 110 or a type of a thin film transistor, but is not limited thereto.

A first transistor T1 including a first active layer ACT1, a first gate electrode GE1, a first source electrode SE1, and a first drain electrode DE1 is disposed on the buffer layer 111.

First, the first active layer ACT1 of the first transistor T1 is disposed on the buffer layer 111. The first active layer ACT1 may be formed of a semiconductor material such as an oxide semiconductor, amorphous silicon, or polysilicon, but is not limited thereto.

A gate insulating layer 112 is disposed on the first active layer ACT1. The gate insulating layer 112 is an insulating layer for electrically insulating the first active layer ACT1 and the first gate electrode GE1 from each other, and may be formed of a single layer or multilayers of silicon oxide (SiOx) or silicon nitride (SiNx), but is not limited thereto.

The first gate electrode GE1 is disposed on the gate insulating layer 112. The first gate electrode GE1 may be integrally formed with a first scan line SL1 and may be electrically connected to the first scan line SL1. The first gate electrode GE1 may be formed of a conductive material, for example, copper (Cu), aluminum (Al), molybdenum (Mo), nickel (Ni), titanium (Ti), chromium (Cr), or an alloy thereof, but is not limited thereto.

A first interlayer insulating layer 113 and a second interlayer insulating layer 114 are disposed on the first gate electrode GE1. Contact holes for connecting each of the first source electrode SE1 and the first drain electrode DE1 to the first active layer ACT1 are formed in the first interlayer insulating layer 113 and the second interlayer insulating layer 114. The first interlayer insulating layer 113 and the second interlayer insulating layer 114 are insulating layers for protecting components thereunder, and may be formed of a single layer or multilayers of silicon oxide (SiOx) or silicon nitride (SiNx), but are not limited thereto.

The first source electrode SE1 and the first drain electrode DE1 that are electrically connected to the first active layer ACT1 are disposed on the second interlayer insulating layer 114. The first source electrode SE1 may be integrally formed with a data line DL and electrically connected to the data line DL, and the first drain electrode DE1 may be electrically connected to a 1-2 capacitor electrode C1*b* of a first capacitor C1. The first source electrode SE1 and the first drain electrode DE1 may be formed of a conductive material, for example, copper (Cu), aluminum (Al), molybdenum (Mo), nickel (Ni), titanium (Ti), chromium (Cr) or an alloy thereof, but are not limited thereto.

A second transistor T2 including a second active layer ACT2, a second gate electrode GE2, a second source electrode SE2, and a second drain electrode DE2 is disposed on the buffer layer 111.

The second active layer ACT2 is disposed on the buffer layer 111. The second active layer ACT2 may be formed of a semiconductor material such as an oxide semiconductor, amorphous silicon, or polysilicon, but is not limited thereto.

The gate insulating layer 112 is disposed on the second active layer ACT2, and the second gate electrode GE2 is disposed on the gate insulating layer 112. The second gate electrode GE2 may be integrally formed with the first scan line SL1 and electrically connected to a first scan line SL1. The second gate electrode GE2 may be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 113 and the second interlayer insulating layer 114 are disposed on the second gate electrode GE2, and the second source electrode SE2 and the second drain electrode DE2 that are electrically connected to the second active layer ACT2 are disposed on the second interlayer insulating layer 114. The second source electrode SE2 is electrically connected to a sixth gate electrode GE6 of the sixth transistor T6 and a 1-1 capacitor electrode C1*a* of the first capacitor C1, and the second drain electrode DE2 is electrically connected to a fifth drain electrode DE5 of a transistor T5 and a fourth source electrode SE4 of a fourth transistor T4. The second source electrode SE2 and the second drain electrode DE2 may be formed of a conductive material, for example, copper (Cu), aluminum (Al), molybdenum (Mo), nickel (Ni), titanium (Ti), chromium (Cr) or an alloy thereof, but are not limited thereto.

A third transistor T3 including a third active layer ACT3, a third gate electrode GE3, a third source electrode SE3, and a third drain electrode DE3 is disposed on the buffer layer 111.

The third active layer ACT3 is disposed on the buffer layer 111. The third active layer ACT3 may be formed of a semiconductor material such as an oxide semiconductor, amorphous silicon, or polysilicon, but is not limited thereto.

The gate insulating layer 112 is disposed on the third active layer ACT3, and the third gate electrode GE3 is disposed on the gate insulating layer 112. The third gate electrode GE3 is integrally formed with an emission control signal line EML and electrically connected to the emission control signal line EML. The third gate electrode GE3 may be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 113 and the second interlayer insulating layer 114 are disposed on the third gate electrode GE3, and the third source electrode SE3 and the third drain electrode DE3 that are electrically connected to the third active layer ACT3 are disposed on the second interlayer insulating layer 114. The third source electrode SE3 is electrically connected to a reference line RL through a fifth source electrode SE5, and the third drain electrode DE3 is electrically connected to the first drain electrode DE1 of the first transistor T1 through the 1-2 capacitor electrode C1b of the first capacitor C1. The third source electrode SE3 and the third drain electrode DE3 may be formed of a conductive material, for example, copper (Cu), aluminum (Al), molybdenum (Mo), nickel (Ni), titanium (Ti), chromium (Cr) or an alloy thereof, but are not limited thereto.

The fourth transistor T4 including a fourth active layer ACT4, a fourth gate electrode GE4, the fourth source electrode SE4, and a fourth drain electrode DE4 is disposed on the buffer layer 111.

The fourth active layer ACT4 is disposed on the buffer layer 111. The fourth active layer ACT4 may be formed of a semiconductor material such as an oxide semiconductor, amorphous silicon, or polysilicon, but is not limited thereto.

The gate insulating layer 112 is disposed on the fourth active layer ACT4, and the fourth gate electrode GE4 is disposed on the gate insulating layer 112. The fourth gate electrode GE4 may be integrally formed with the emission control signal line EML and electrically connected to the emission control signal line EML. The fourth gate electrode GE4 may be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 113 and the second interlayer insulating layer 114 are disposed on the fourth gate electrode GE4, and the fourth source electrode SE4 and the fourth drain electrode DE4 that are electrically connected to the fourth active layer ACT4 are disposed on the second interlayer insulating layer 114. The fourth source electrode SE4 is connected to the fifth drain electrode DE5 of the fifth transistor T5, and the fourth drain electrode DE4 is connected to a low potential power line VSS. In this case, the low potential power line VSS and the fourth drain electrode DE4 may be formed of the same material on the same layer and may be integrally formed. The fourth source electrode SE4 and the fourth drain electrode DE4 may be formed of a conductive material, for example, copper (Cu), aluminum (Al), molybdenum (Mo), nickel (Ni), titanium (Ti), chromium (Cr) or an alloy thereof, but are not limited thereto.

The fifth transistor T5 including a fifth active layer ACT5, a fifth gate electrode GE5, a fifth source electrode SE5, and the fifth drain electrode DE5 is disposed on the buffer layer 111.

The fifth active layer ACT5 is disposed on the buffer layer 111. The fifth active layer ACT5 may be formed of a semiconductor material such as an oxide semiconductor, amorphous silicon, or polysilicon, but is not limited thereto.

The gate insulating layer 112 is disposed on the fifth active layer ACT5, and the fifth gate electrode GE5 is disposed on the gate insulating layer 112. The fifth gate electrode GE5 is connected to the second scan line SL2. The fifth gate electrode GE5 may be formed of the same material on the same layer as the second scan line SL2 and may be integrally formed. The fifth gate electrode GE5 may be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 113 and the second interlayer insulating layer 114 are disposed on the fifth gate electrode GE5, and the fifth source electrode SE5 and the fifth drain electrode DE5 that are electrically connected to the fifth active layer ACT5 are disposed on the second interlayer insulating layer 114. The fifth source electrode SE5 is connected to the reference line RL, and the fifth drain electrode DE5 is connected to a sixth drain electrode DE6 of the sixth transistor T6. The fifth source electrode SE5 and the fifth drain electrode DE5 may be formed of a conductive material, for example, copper (Cu), aluminum (Al), molybdenum (Mo), nickel (Ni), titanium (Ti), chromium (Cr) or an alloy thereof, but is not limited thereto.

The sixth transistor T6 including the sixth active layer ACT6, a sixth gate electrode GE6, a sixth source electrode SE6, and the sixth drain electrode DE6 is disposed on the buffer layer 111.

The sixth active layer ACT6 is disposed on the buffer layer 111. The sixth active layer ACT6 may be formed of a semiconductor material such as an oxide semiconductor, amorphous silicon, or polysilicon, but is not limited thereto.

The gate insulating layer 112 is disposed on the sixth active layer ACT6, and the sixth gate electrode GE6 is disposed on the gate insulating layer 112. The sixth gate electrode GE6 is connected to the 1-1 capacitor electrode C1a of the first capacitor C1 and the second source electrode SE2 of the second transistor T2. The sixth gate electrode GE6 may be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 113 and the second interlayer insulating layer 114 are disposed on the sixth gate electrode GE6, and the sixth source electrode SE6 and the sixth drain electrode DE6 that are electrically connected to the sixth active layer ACT6 are disposed on the second interlayer insulating layer 114. The sixth source electrode SE6 is connected to a third capacitor C3 and a cathode 125 of the light emitting element 120, and the sixth drain electrode DE6 is connected to the fifth drain electrode DE5 of the fifth transistor T5. The sixth source electrode SE6 and the sixth drain electrode DE6 may be formed of a conductive material, for example, copper (Cu), aluminum (Al), molybdenum (Mo), nickel (Ni), titanium (Ti), chromium (Cr) or an alloy thereof, but is not limited thereto.

A seventh transistor T7 including a seventh active layer ACT7, a seventh gate electrode GE7, a seventh source electrode SE7, and a seventh drain electrode DE7 is disposed on the buffer layer 111.

The seventh active layer ACT7 is disposed on the buffer layer 111. The seventh active layer ACT7 may be formed of a semiconductor material such as an oxide semiconductor, amorphous silicon, or polysilicon, but is not limited thereto.

The gate insulating layer 112 is disposed on the seventh active layer ACT7, and the seventh gate electrode GE7 is disposed on the gate insulating layer 112. The seventh gate electrode GE7 is connected to the first scan line SL1. The seventh gate electrode GE7 and the first scan line SL1 may be integrally formed and electrically connected to each other. The seventh gate electrode GE7 may be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 113 and the second interlayer insulating layer 114 are disposed on the seventh gate electrode GE7, and the seventh source electrode SE7 and the seventh drain electrode DE7 that are electrically connected to the seventh active layer ACT7 are disposed on the second interlayer insulating layer 114. The seventh source electrode SE7 is connected to a high potential power line VDD, and the seventh drain electrode DE7 is connected to the cathode 125 of the light emitting element 120 and the third capacitor C3. The seventh source electrode SE7 and the seventh drain electrode DE7 may be formed of a conductive material, for example, copper (Cu), aluminum (Al), molybdenum (Mo), nickel (Ni), titanium (Ti), chromium (Cr) or an alloy thereof, but is not limited thereto.

The first capacitor C1 is disposed on the gate insulating layer 112. The first capacitor C1 includes the 1-1 capacitor electrode C1a and the 1-2 capacitor electrode C1b.

First, the 1-1 capacitor electrode C1a is disposed on the gate insulating layer 112. The 1-1 capacitor electrode C1a may be formed integrally with the sixth gate electrode GE6 of the sixth transistor T6. Accordingly, the 1-1 capacitor electrode C1a may be electrically connected to the sixth gate electrode GE6 and the second source electrode SE2.

The 1-2 capacitor electrode C1b is disposed on the first interlayer insulating layer 113. The 1-2 capacitor electrode C1b is disposed to overlap the 1-1 capacitor electrode C1a with the first interlayer insulating layer 113 interposed therebetween. In addition, the 1-2 capacitor electrode C1b may be electrically connected to the first drain electrode DE1 and the third drain electrode DE3.

A second capacitor C2 is disposed on the gate insulating layer 112. The second capacitor C2 includes a 2-1 capacitor electrode C2a and a 2-2 capacitor electrode C2b.

The 2-1 capacitor electrode C2a is disposed on the gate insulating layer 112. The 2-1 capacitor electrode C2a may be electrically connected to the sixth source electrode SE6 and the light shielding layer LS.

The 2-2 capacitor electrode C2b is disposed on the first interlayer insulating layer 113 and the second interlayer insulating layer 114. The 2-2 capacitor electrode C2b is disposed to overlap the 2-1 capacitor electrode C2a with the first interlayer insulating layer 113 and the second interlayer insulating layer 114 interposed therebetween. The 2-2 capacitor electrode C2b may be integrally formed with the high potential power line VDD and electrically connected to the high potential power line VDD.

The third capacitor C3 is disposed on the substrate 110. The third capacitor C3 includes a 3-1 capacitor electrode C3a, a 3-2 capacitor electrode C3b, and a 3-3 capacitor electrode C3c. The 3-1 capacitor electrode C3a may be defined as a lower capacitor electrode, the 3-2 capacitor C3b may be defined as an intermediate capacitor electrode, and the 3-3 capacitor electrode C3c may be defined as an upper capacitor electrode.

The 3-1 capacitor electrode C3a is disposed on the substrate 110. The 3-1 capacitor electrode C3a is a portion extending from the light shielding layer LS and may be integrally formed with the light shielding layer LS. In this case, the 3-1 capacitor electrode C3a may be electrically connected to the 2-1 capacitor electrode C2a and the sixth source electrode SE6 through contact holes formed in the buffer layer 111 and the gate insulating layer 112.

The 3-2 capacitor electrode C3b is disposed on the buffer layer 111 and the gate insulating layer 112. The 3-2 capacitor electrode C3b is a portion extending from the sixth gate electrode GE6 and may be disposed to overlap the 3-1 capacitor electrode C3a. The 3-2 capacitor electrode C3b may be electrically connected to the sixth gate electrode GE6 of the sixth transistor T6 and the second source electrode SE2.

The 3-3 capacitor electrode C3c is disposed on the first interlayer insulating layer 113. The 3-3 capacitor electrode C3c may include a first layer C3c' and a second layer C3c''. The first layer C3c' of the 3-3 capacitor electrode C3c may have an island-shaped pattern that is formed of the same material and formed on the same layer as the 1-2 capacitor electrode C1b. The first layer C3c' may be disposed to overlap the 3-1 capacitor electrode C3a and the 3-2 capacitor electrode C3b with the first interlayer insulating layer 113 interposed therebetween.

The second layer C3c'' of the 3-3 capacitor electrode C3c is disposed on the second interlayer insulating layer 114. The second layer C3c'' is a portion extending from the sixth source electrode SE6 and may be connected to the first layer C3c' through a contact hole of the second interlayer insulating layer 114.

The first scan line SL1, the second scan line SL2, and the emission control signal line EML are disposed on the gate insulating layer 112. The first scan line SL1, the second scan line SL2, and the emission control signal line EML may extend in a row direction and may be disposed along the plurality of sub-pixels SP disposed in the same row.

The first scan line SL1 is integrally formed with the first gate electrode GE1, the second gate electrode GE2, and the seventh gate electrode GE7. The first scan line SL1 may transfer a scan signal to the first transistor T1, the second transistor T2, and the seventh transistor T7 and may turn on or turn off the first transistor T1, the second transistor T2, and the seventh transistor T7. The second scan line SL2 is integrally formed with the fifth gate electrode GE5. and the second scan line SL2 may transfer a scan signal to the fifth transistor T5 and may turn on or turn off the fifth transistor T5. The emission control signal line EML is integrally formed with the third gate electrode GE3 and the fourth gate electrode GE4. The emission control signal line EML may transfer an emission control signal to the third transistor T3 and the fourth transistor T4 and may turn on or turn off the third transistor T3 and the fourth transistor T4.

The reference line RL is disposed on the first interlayer insulating layer 113. The reference line RL may extend in the row direction and may be disposed along the plurality of sub-pixels SP disposed in the same row.

The data line DL, the high potential power line VDD, and the low potential power line VSS are disposed on the second interlayer insulating layer 114. The data line DL, the high potential power line VDD, and the low potential power line VSS may extend in a column direction and may be disposed along the plurality of sub-pixels SP disposed in the same column.

A passivation layer 115 is disposed on the first transistor T1, the second transistor T2, the third transistor T3, the fourth transistor T4, the fifth transistor T5, the sixth transistor T6, the first capacitor C1, the second capacitor C2, and the third capacitor C3. The passivation layer 115 is an insulating layer for protecting components under the passivation layer 115, and may be formed of any one of an inorganic material such as silicon oxide (SiOx) or silicon nitride (SiNx) or an organic material such as benzocyclobutene or acryl-based material, but is not limited thereto.

Referring to FIGS. 3B and 4 together, reflectors RF are disposed on the passivation layer 115. The reflector RF is a reflector for reflecting light emitted from the light emitting element 120, upwardly of the substrate 110, and may have a shape corresponding to each of the plurality of sub-pixels SP. One reflector RF may be disposed to cover a majority of an area of one sub-pixel SP. In other words, one reflector RF may be disposed in a region basically corresponding to the region occupied by each of the plurality of sub-pixels SP.

For example, when the plurality of sub-pixels SP include a first sub-pixel SP1, a second sub-pixel SP2, a third sub-pixel SP3, and a fourth sub-pixel SP4 that are disposed in the same row, the reflectors RF may include a first reflector RF1 corresponding to the first sub-pixel SP1, a second reflector RF2 corresponding to the second sub-pixel SP2, a third reflector RF3 corresponding to the third sub-pixel SP3, and a fourth reflector RF4 corresponding to the fourth sub-pixel SP4.

The first reflector RF1 includes a 1-1 reflector RF1a that overlaps a majority of the first sub-pixel SP1 and a 1-2 reflector RF1b that overlaps the light emitting element 120 of the first sub-pixel SP1. The 1-1 reflector RF1a is a reflector RF that is electrically connected to the cathode 125 of the light emitting element 120, the sixth source electrode SE6 of the sixth transistor T6, and the third capacitor C3. Further, the 1-1 reflector RF1a may be used for a repair of the first sub-pixel SP1 simultaneously with reflecting the light emitted from the light emitting element 120, upwardly of the light emitting element 120. When the first sub-pixel SP1 is defective, the first sub-pixel SP1 may be repaired by electrically connecting the 1-1 reflector RF1a that is connected to the cathode 125 of the light emitting element 120 to the 1-1 reflector RF1a of the first sub-pixel SP1 in a row adjacent thereto. The 1-2 reflector RF1b may reflect the light emitted from the light emitting element 120, upwardly of the light emitting element 120.

The second reflector RF2 includes a 2-1 reflector RF2a that overlaps a majority of the second sub-pixel SP2 and a 2-2 reflector RF2b that overlaps the light emitting element 120 of the second sub-pixel SP2. The 2-1 reflector RF2a is a reflector RF that is electrically connected to the cathode 125 of the light emitting element 120, the sixth source electrode SE6 of the sixth transistor T6, and the third capacitor C3. Further, the 2-1 reflector RF2a may be used for a repair of the second sub-pixel SP2 simultaneously with reflecting light emitted from the light emitting element 120, upwardly of the light emitting element 120. Specifically, when the second sub-pixel SP2 is defective, the second sub-pixel SP2 may be repaired by electrically connecting the 2-1 reflector RF2a thereof to the 2-1 reflector RF2a of the second sub-pixel SP2 in a row adjacent thereto. The 2-2 reflector RF2b may reflect the light emitted from the light emitting element 120, upwardly of the light emitting element 120.

The third reflector RF3 may be formed of one third reflector RF3 that overlaps an entirety of the third sub-pixel SP3. The third reflector RF3 is a reflector RF that is electrically connected to the cathode 125 of the light emitting element 120 of the third sub-pixel SP3, the sixth source electrode SE6 of the sixth transistor T6, and the third capacitor C3. Further, the third reflector RF3 may be used for a repair of the third sub-pixel SP3 simultaneously with reflecting the light emitted from the light emitting element 120, upwardly of the light emitting element 120. When the third sub-pixel SP3 is defective, the third sub-pixel SP3 may be repaired by electrically connecting the third reflector RF3 thereof to the third reflector RF3 of the third sub-pixel SP3 in a row adjacent thereto.

The fourth reflector RF4 may be formed of one fourth reflector RF4 that overlaps an entirety of the fourth sub-pixel SP4. The fourth reflector RF4 is a reflector RF that is electrically connected to the cathode 125 of the light emitting element 120 of the fourth sub-pixel SP4, the sixth source electrode SE6 of the sixth transistor T6, and the third capacitor C3. Further, the fourth reflector RF4 may be used for a repair of the fourth sub-pixel SP4 simultaneously with reflecting the light emitted from the light emitting element 120, upwardly of the light emitting element 120. When the fourth sub-pixel SP4 is defective, the fourth sub-pixel SP4 may be repaired by electrically connecting the fourth reflector RF4 thereof to the fourth reflector RF4 of the fourth sub-pixel SP4 in a row adjacent thereto.

A process of repairing a defective sub-pixel SP using the reflector RF will be described later with reference to FIGS. 5 to 8B.

Meanwhile, although descriptions are made that the first sub-pixel SP1 and the second sub-pixel SP2 include two reflectors RF, and the third sub-pixel SP3 and the fourth sub-pixel SP4 include one reflector RF, the reflector RF may be designed variously to include the reflector RF connected to the cathode 125 of the light emitting element 120. For example, in all of the plurality of sub-pixels SP, only one reflector RF may be disposed as in the third sub-pixel SP3 and the fourth sub-pixel SP4, and a plurality of reflectors RF may be disposed as in the first sub-pixel SP1 and the second sub-pixel SP2, but the present disclosure is not limited thereto.

Referring to FIG. 4, an adhesive layer AD is disposed on the reflector RF. The adhesive layer AD is a layer for fixing the light emitting elements 120 disposed on the adhesive layer AD, and may be formed of an adhesive material such as resin, but is not limited thereto.

The light emitting elements 120 are disposed on the adhesive layer AD. The light emitting elements 120 are elements that emit light by an electric current. The light emitting elements 120 may include the light emitting elements that emit red light, green light, blue light, and the like, and may implement light of various colors including white through a combination of these elements. For example, the light emitting element 120 may be a light emitting diode (LED) or a micro-LED, but is not limited thereto.

The light emitting element 120 includes a first semiconductor layer 121, a light emitting layer 122, a second semiconductor layer 123, an anode 124, and the cathode 125.

The first semiconductor layer 121 is disposed on the adhesive layer AD, and the second semiconductor layer 123 is disposed on the first semiconductor layer 121. The first semiconductor layer 121 and the second semiconductor layer 123 may be layers that are formed by doping a specific material with n-type impurities and p-type impurities. For example, the first semiconductor layer 121 and the second semiconductor layer 123 may be layers that are formed by doping a material such as gallium nitride (GaN), indium aluminum phosphide (InAlP), gallium arsenide (GaAs) or the like with n-type impurities or p-type impurities. In addition, the p-type impurities may be magnesium (Mg), zinc (Zn), beryllium (Be) and the like, and the n-type impurities may be silicon (Si), germanium (Ge), tin (Sn) and the like, but the present disclosure is not limited thereto.

The light emitting layer 122 is disposed between the first semiconductor layer 121 and the second semiconductor layer 123. The light emitting layer 122 may receive holes and electrons from the first semiconductor layer 121 and the second semiconductor layer 123 to emit light. The light emitting layer 122 may have a single-layer or multi-quantum well (MQW) structure, and may be formed of, for example, indium gallium nitride (InGaN) or gallium nitride (GaN), but is limited thereto.

The anode 124 is disposed on the first semiconductor layer 121 and the cathode 125 is disposed on the second semiconductor layer 123. In this case, in order to dispose the anode 124 on the first semiconductor layer 121, the first semiconductor layer 121 may partially protrude from the light emitting layer 122 and the second semiconductor layer 123. The anode 124 may be formed on a portion of an upper surface of the first semiconductor layer 121 that protrudes from the light emitting layer 122 and the second semiconductor layer 123. The cathode 125 may be formed on an upper surface of the second semiconductor layer 123.

Meanwhile, although not shown in the drawings, a protective layer surrounding the light emitting element 120 may be disposed. The protective layer may cover at least a side surface of the first semiconductor layer 121, a side surface of the light emitting layer 122, and a side surface of the second semiconductor layer 123 of the light emitting element 120 among outer side surfaces of the light emitting element 120. An electrical short-circuit between the first semiconductor layer 121 and the second semiconductor layer 123 may be prevented when the anode 124 and the cathode 125 are formed by forming a protective layer surrounding the light emitting element 120.

Planarization layers including a first planarization layer 116 and a second planarization layer 117 are disposed on the light emitting element 120 and the adhesive layer AD. The planarization layers may planarize an upper portion of the substrate 110 on which the light emitting element 120 is disposed, and may fix and protect the light emitting element 120. Each of the first planarization layer 116 and the second planarization layer 117 may be formed of a single layer or multilayers, for example, may be formed of benzocyclobutene or an acryl-based organic material, but is not limited thereto.

A connection electrode CE that connects the light emitting element 120 to the pixel circuit PC and the high potential power line VDD is disposed on the planarization layer. The connection electrode CE includes an anode connection electrode CE1 and a cathode connection electrode CE2.

The anode connection electrode CE1 is an electrode that electrically connects the anode 124 of the light emitting element 120, the high potential power line VDD, and the second capacitor C2. The anode connection electrode CE1 may be connected to the anode 124 of the light emitting element 120 through a contact hole formed in the second planarization layer 117.

The cathode connection electrode CE2 is an electrode that electrically connects the cathode 125 of the light emitting element 120 and the sixth source electrode SE6 of the sixth transistor T6, the third capacitor C3, and the second capacitor C2. The cathode connection electrode CE2 may be connected to the reflector RF of each of the plurality of sub-pixels SP through contact holes formed in the adhesive layer AD, the first planarization layer 116, and the second planarization layer 117. In this case, the sixth source electrode SE6 of the sixth transistor T6, the third capacitor C3, and the second capacitor C2 and the cathode 125 of the light emitting element 120 may be electrically connected through the reflector RF and the cathode connection electrode CE2.

A bank 118 is disposed on the planarization layers. As shown in the drawing, the bank 118 may be disposed on the first planarization layer 116 that is exposed from the second planarization layer 117 or may be disposed on the second planarization layer 117 among the planarization layers, and is not limited thereto. The bank 118 may be formed of an opaque material to reduce color mixing between the plurality of sub-pixels SP, for example, black resin, but is not limited thereto.

A protective layer 119 is disposed on the connection electrode CE and the bank 118. The protective layer 119 is a layer for protecting components under the protective layer 119, and may be formed of a single layer or multilayers of light-transmissive epoxy, silicon oxide (SiOx), or silicon nitride (SiNx), but is not limited thereto.

Meanwhile, in the display device 100 according to an embodiment of the present disclosure, a defective sub-pixel SP may be repaired by using the third capacitor C3 and the reflector RF. Hereinafter, a method of repairing the defective sub-pixel SP will be described with reference to FIGS. 5 to 8B.

Figure 5:
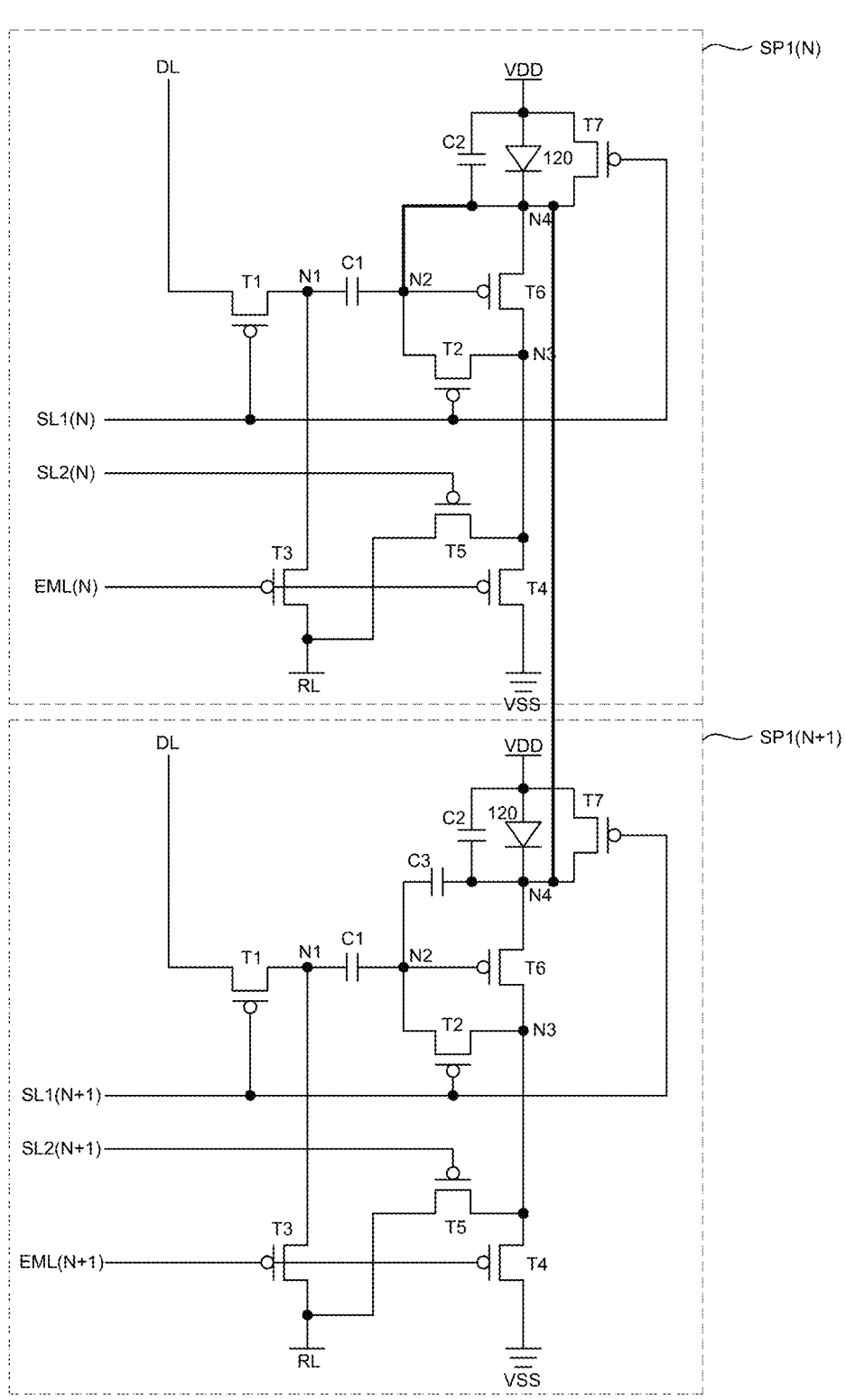
FIG. 5 is a circuit diagram for explaining a repair process of a sub-pixel in the display device according to an embodiment of the present disclosure.
Figure 6A:
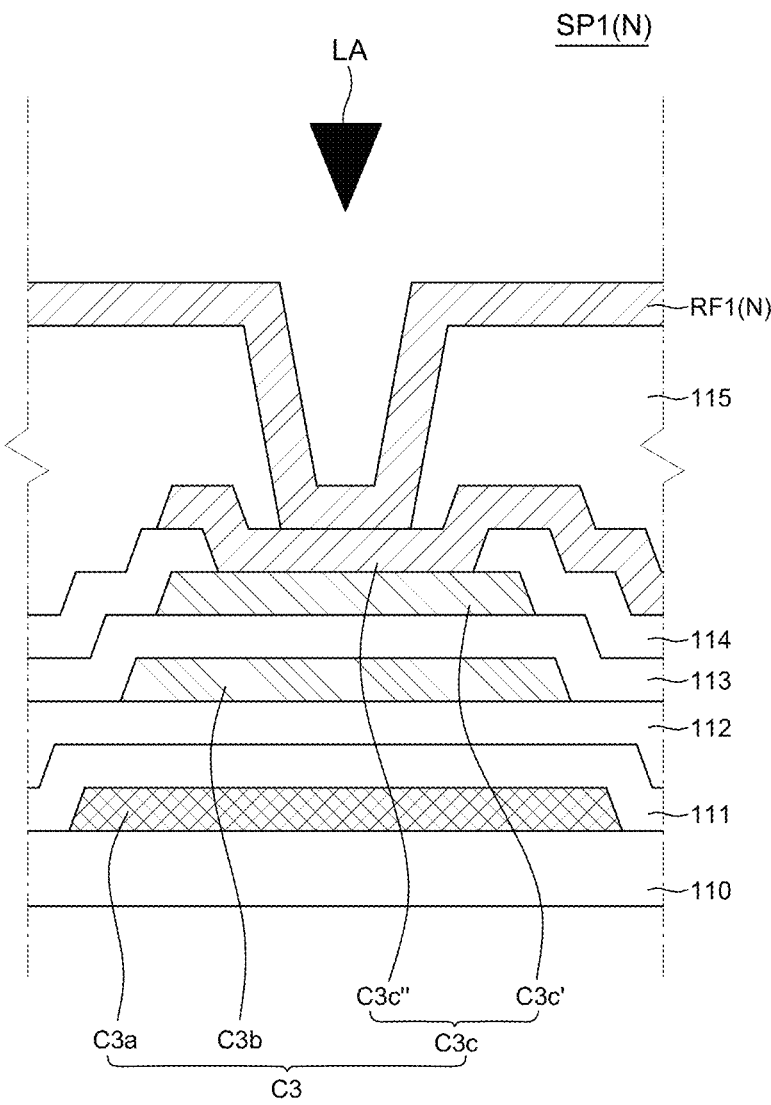
FIGS. 6A and 6B are cross-sectional views of a third capacitor of the display device according to an embodiment of the present disclosure.
Figure 6B:
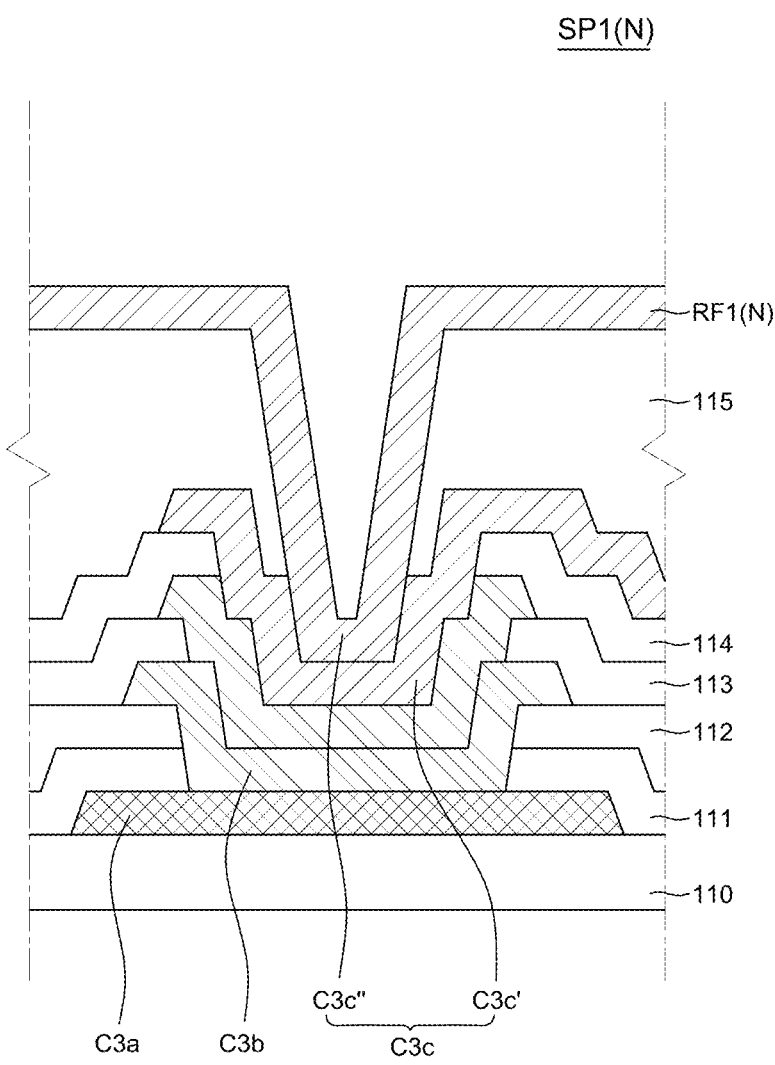
Figure 7:
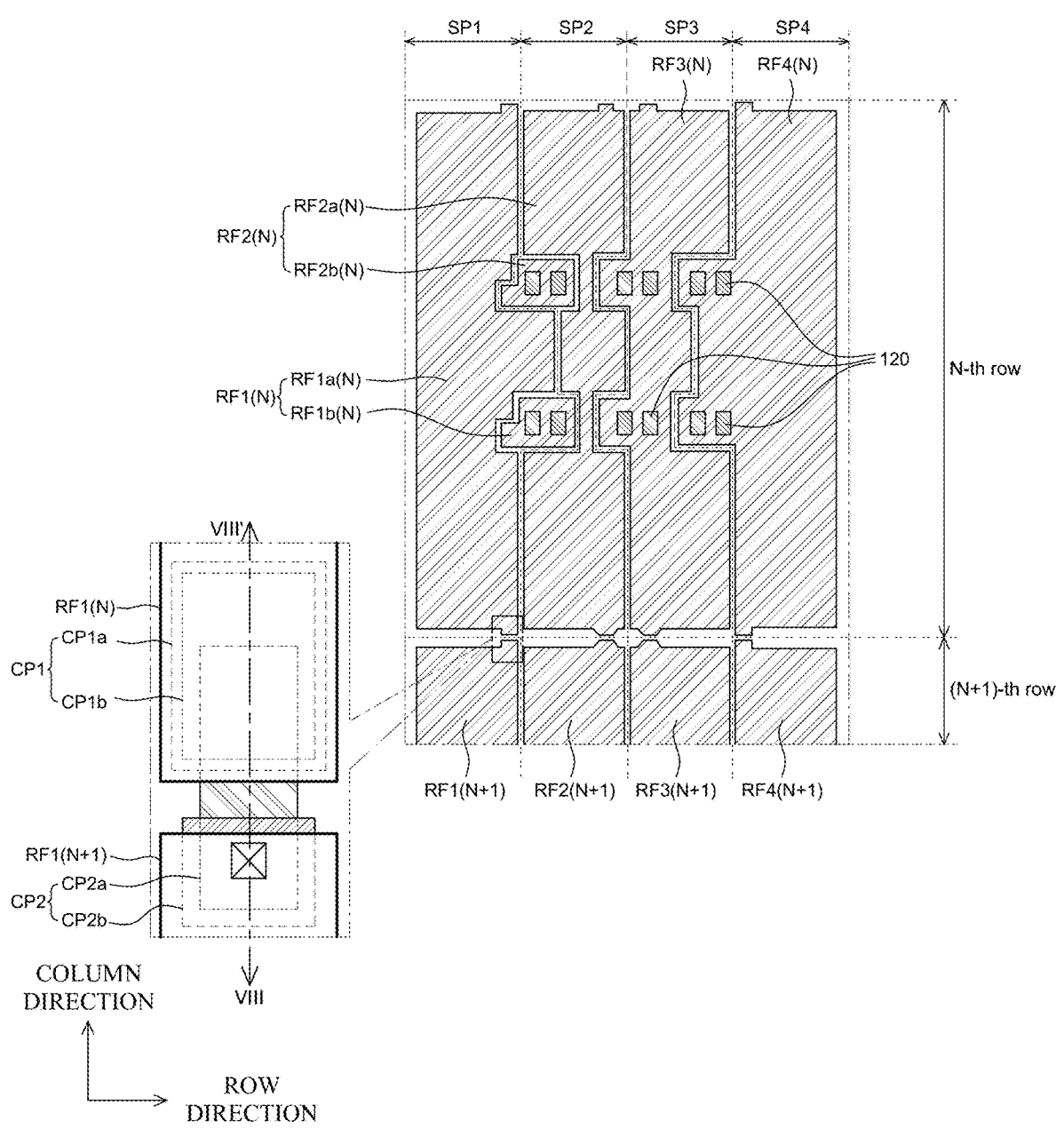
FIG. 7 is an enlarged plan view of the display device according to an embodiment of the present disclosure.
Figure 8A:
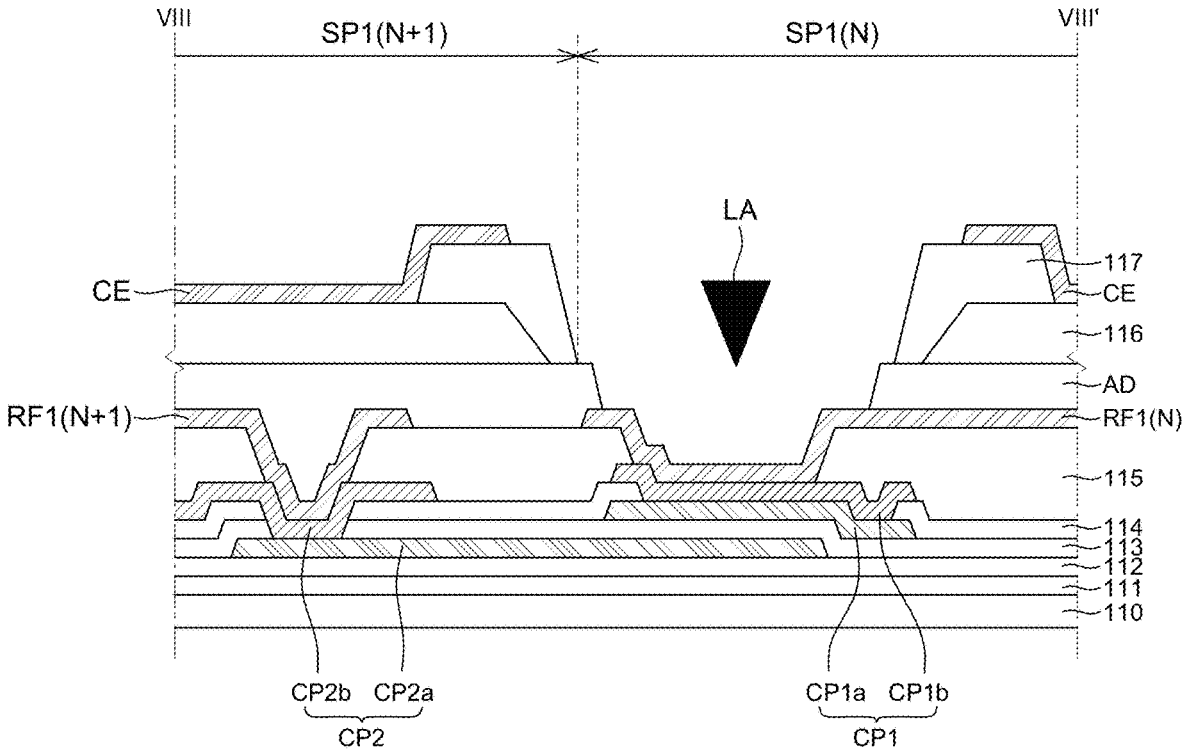
FIGS. 8A and 8B are cross-sectional views taken along line VIII-VIII' of FIG. 7.
Figure 8B:
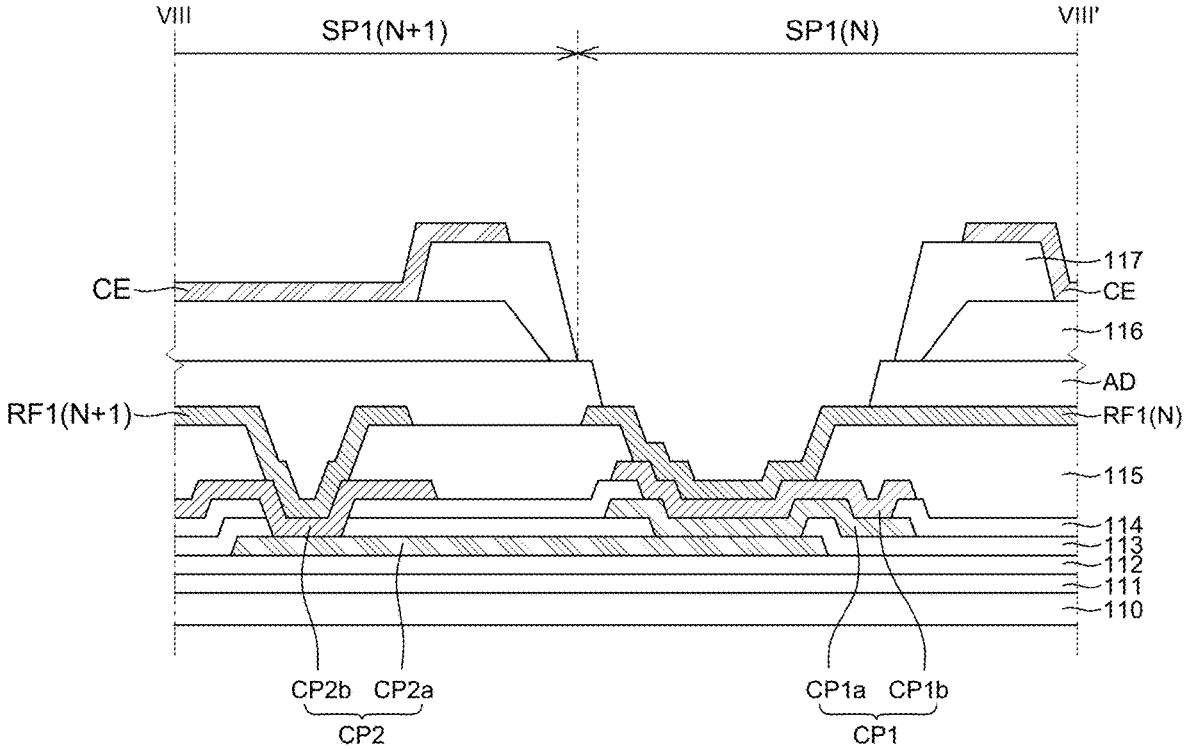

FIG. 5 is a circuit diagram for explaining a repair process of a sub-pixel in the display device according to an embodiment of the present disclosure. FIGS. 6A and 6B are cross-sectional views of a third capacitor of the display device according to an embodiment of the present disclosure. FIG. 7 is an enlarged plan view of the display device according to an embodiment of the present disclosure. FIGS. 8A and 8B are cross-sectional views taken along line VIII-VIII' of FIG. 7. FIG. 6A is a cross-sectional view of the third capacitor before a welding process is performed, and FIG. 6B is a cross-sectional view of the third capacitor after the welding process is performed. FIG. 8A is a cross-sectional view before a welding process is performed, and FIG. 8B is a cross-sectional view after the welding process is performed.

Hereinafter, descriptions are made on the assumption of a case in which when a defect occurs in a first sub-pixel SP1(N) disposed in an N-th row among a plurality of rows, the first sub-pixel SP1(N) in the N-th row is repaired using a first sub-pixel SP1(N+1) in an (N+1)-th row adjacent to the N-th row will be described.

First, when a defect occurs in a specific sub-pixel SP, a dark spot or bright spot defect may occur. For example, when a defect occurs in the light emitting element 120, a short-circuit defect occurs in the plurality of transistors and the plurality of capacitors due to foreign substances or static electricity, or when the transistors are driven abnormally, a dark spot defect in which the light emitting element 120 does not emit light or a bright spot defect in which the light emitting element 120 continuously emits light may occur. If a defect occurs in the pixel circuit PC including the plurality of transistors and the plurality of capacitors, the pixel circuit PC may not be driven so that the light emitting element 120 does not emit light by the defective pixel circuit PC, and the light emitting element 120 in the defective sub pixel SP and the pixel circuit PC in an adjacent sub-pixel SP are electrically connected so that the light emitting element 120 can be normally driven.

Referring to FIGS. 5 to 6B, when a defect occurs in the first sub-pixel SP1(N) in the N-th row, a welding process is performed on the third capacitor C3 so that the first sub-pixel SP1(N) in the N-th row can be blackened or darkened. That is, the pixel circuit PC of the first sub-pixel SP1(N) can no longer be driven by the welding process. Specifically, a bright spot defect in which the light emitting element 120 continuously emits light may occur due to the defective pixel circuit PC. In this case, a welding process in which a portion of the pixel circuit PC is short-circuited may be performed so that the light emitting element 120 no longer emits light due to the defective pixel circuit PC.

Referring to FIG. 6A, the sixth gate electrode GE6 and the sixth source electrode SE6 of the sixth transistor T6 that functions as a driving transistor may be connected to each other by irradiating a laser LA to the third capacitor C3.

The third capacitor C3 is a capacitor connected between the sixth gate electrode GE6 and the sixth source electrode SE6 of the sixth transistor T6 functioning as a driving transistor. The third capacitor C3 includes a 3-2 capacitor electrode C3*b* that is connected to the sixth gate electrode GE6, and a 3-1 capacitor electrode C3*a* and a 3-3 capacitor electrode C3*c* that are respectively disposed on a lower portion and an upper portion of the 3-2 capacitor electrode C3*b* and connected to the sixth source electrode SE6. In addition, an insulating layer is disposed between the 3-1 capacitor electrode C3*a* and the 3-2 capacitor electrode C3*b* and between the 3-2 capacitor electrode C3*b* and the 3-3 capacitor electrode C3*c*, so that the 3-1 capacitor electrode C3*a*, the 3-2 capacitor electrode C3*b*, and the 3-3 capacitor electrode C3*c* are spaced apart from one another.

Referring to FIGS. 6A and 6B, when a welding process is performed by irradiating the laser LA to the electrodes of the third capacitor C3, the first interlayer insulating layer 113 between the 3-2 capacitor electrode C3*b* and the 3-3 capacitor electrode C3*c* and the buffer layer 111 and the gate insulating layer 112 between the 3-1 capacitor electrode C3*a* and the 3-2 capacitor electrode C3*b* are opened, and the 3-1 capacitor electrode C3*a*, the 3-2 capacitor electrode C3*b*, and the 3-3 capacitor electrode C3*c* may be partially melted and connected to each other. In this case, the sixth source electrode SE6 and the sixth gate electrode GE6 of the sixth transistor T6 may be short-circuited by the 3-1 capacitor electrode C3*a*, the 3-2 capacitor electrode C3*b*, and the 3-3 capacitor electrode C3*c* that are connected to each other by the welding process. Accordingly, a voltage Vgs between the sixth gate electrode GE6 and the sixth source electrode SE6 may be 0 V all the time, and the sixth transistor T6 may no longer be turned on. In other words, the sixth transistor T6 is disabled.

Accordingly, by performing a welding process on the third capacitor C3 of the first sub-pixel SP1(N) in the N-th row in which a defect occurs, the 3-1 capacitor electrode C3*a*, the 3-2 capacitor electrode C3*b*, and the 3-3 capacitor electrode C3*c* of the third capacitor C3 may be connected to each other, and the sixth gate electrode GE6 and the sixth source electrode SE6 of the sixth transistor T6 may be short-circuited, so that the bright spot defect of the light emitting element 120 may be prevented.

Referring to FIGS. 5 and 7 together, after the welding process of the third capacitor C3 is completed, the cathode 125 of the light emitting element 120 of the first sub-pixel SP1(N) in the N-th row, which is the defective sub-pixel SP, may be electrically connected to the cathode 125 of the light emitting element 120 of the first sub-pixel SP1(N+1) in the (N+1)-th row, which is a normal sub-pixel SP. The light emitting element 120 of the first sub-pixel SP1(N) in the N-th row is electrically connected to the sixth transistor T6 in the first sub-pixel SP1(N+1) in the (N+1)-th row, so that the light emitting element 120 of the defective sub-pixel SP may be driven by the pixel circuit PC of the normal sub-pixel SP.

In this case, a first reflector RF1(N) of the first sub-pixel SP1(N) in the N-th row and a first reflector RF1(N+1) of the first sub-pixel SP1(N+1) in the (N+1)-th row are electrically connected, so that the cathodes 125 of each of the first sub-pixel SP1(N) in the N-th row and the first sub-pixel SP1(N+1) in the (N+1)-th row may be connected to each other. As described above with reference to FIGS. 3A to 4, the reflector RF of each of the plurality of sub-pixels SP may be electrically connected to the cathode 125 of the light emitting element 120. Therefore, in a method of connecting the reflectors RF of each of the first sub-pixel SP1(N+1) in a normal (N+1)-th row and the first sub-pixel SP1(N) in the N-th row in which a defect occurs, the first sub-pixel SP1(N) in the N-th row may be repaired.

First, since the reflector RF is disposed to cover a majority of the sub-pixel SP, an outermost portion of the reflector RF may be disposed adjacent to the reflector RF of the sub-pixel SP adjacent thereto. For example, the first reflector RF1(N) of the first sub-pixel SP1(N) in the N-th row and the first reflector RF1 (N+1) of the first sub-pixel SP1(N+1) in the (N+1)-th row may be disposed adjacent to each other.

In this case, when all of the plurality of sub-pixels SP are normal sub-pixels SP, the reflector RF of each of the plurality of sub-pixels SP may be electrically insulated from the reflector RF of the sub-pixel SP adjacent thereto.

However, when some sub-pixels SP among the plurality of sub-pixels SP are defective sub-pixels SP, the reflector RF of the defective sub-pixel SP and the reflector RF of the sub-pixels adjacent to the defective sub-pixel SP may be electrically connected to each other.

For example, referring to FIGS. 8A and 8B, the first reflector RF1(N) of the first sub-pixel SP1(N) in the N-th row and the first reflector RF1(N+1) of the first sub-pixel SP1(N+1) in the (N+1)-th row may be connected to each other through a welding process. To electrically connect the first reflector RF1(N) of the first sub-pixel SP1(N) in the N-th row and the first reflector RF1(N+1) of the first sub-pixel SP1(N+1) in the (N+1)-th row, a first connection pattern CP1 and a second connection pattern CP2 may be further disposed.

The first connection pattern CP1 is an electrode that is electrically connected to the first reflector RF1(N) of the first sub-pixel SP1(N) in the N-th row. The second connection pattern CP2 is an electrode that is electrically connected to the first reflector RF1(N+1) of the first sub-pixel SP1(N+1) in the (N+1)-th row, extends toward the first reflector RF1(N) of the first sub-pixel SP1(N) in the N-th row and overlaps the first connection pattern CP1.

The reflector RF of each of the plurality of sub-pixels SP may be connected to the first connection pattern CP1 that is connected to an edge of the reflector RF and the second connection pattern CP2 that extends toward the reflector RF in an adjacent row. In this case, the first connection pattern CP1 of each of the plurality of sub-pixels SP may partially overlap the second connection pattern CP2 of each of the sub-pixels SP in an adjacent row. In addition, by irradiating the laser LA to an overlap portion of the first connection pattern CP1 and the second connection pattern CP2, the reflectors RF of the sub-pixels SP adjacent to each other may be connected to each other.

Referring to FIGS. 7 and 8A, the first connection pattern CP1 is disposed on the first interlayer insulating layer 113 in the first sub-pixel SP1(N) in the N-th row. The first connection pattern CP1 includes a 1-1 connection pattern CP1*a* and a 1-2 connection pattern CP1*b*. The 1-1 connection pattern CP1*a* is disposed on the first interlayer insulating layer 113. The 1-2 connection pattern CP1*b* is disposed on the second interlayer insulating layer 114 and is connected to the 1-1 connection pattern CP1a through a contact hole formed in the second interlayer insulating layer 114. And, the 1-2 connection pattern CP1*b* may be electrically connected to the first reflector RF1(N) of the first sub-pixel SP1(N) in the N-th row through a contact hole formed in the passivation layer 115.

The second connection pattern CP2 is disposed on the gate insulating layer 112 in the first sub-pixel SP1 (N+1) in the (N+1)-th row. The second connection pattern CP2 includes a 2-1 connection pattern CP2*a* and a 2-2 connection pattern CP2*b*. The 2-1 connection pattern CP2*a* is a portion that is disposed on the gate insulating layer 112 and extends toward the first connection pattern CP1 of the sub-pixel SP adjacent thereto. The 2-2 connection pattern CP2*b* is a portion that is disposed on the second interlayer insulating layer 114 and is connected to the 2-1 connection pattern CP2*a* through contact holes formed in the first interlayer insulating layer 113 and the second interlayer insulating layer 114. In addition, the 2-2 connection pattern CP2*b* may be electrically connected to the first reflector RF1 (N+1) of the first sub-pixel SP1(N+1) in the (N+1)-th row through contact holes formed in the passivation layer 115.

In this case, the second connection pattern CP2 may extend toward the first connection pattern CP1 and overlap the first connection pattern CP1. For example, the 2-1 connection pattern CP2*a* may overlap the first connection pattern CP1 with the first interlayer insulating layer 113 interposed therebetween.

Referring to FIGS. 8A and 8B, when a welding process is performed by irradiating the laser LA onto the first connection pattern CP1 and the second connection pattern CP2, the first interlayer insulating layer 113 is opened, and the first connection pattern CP1 and the second connection pattern CP2 may be electrically connected to each other. Accordingly, the first reflector RF1(N) of the first sub-pixel SP1(N) in the N-th row may be electrically connected to the first reflector RF1(N+1) of the first sub-pixel SP1(N+1) in the adjacent (N+1)-th row through the first connection pattern CP1 and the second connection pattern CP2, and the light emitting element 120 of the first sub-pixel SP1(N) in the N-th row can be driven normally. In this case, a driving current for driving the light emitting element 120 in the N-th row and a driving current for driving the light emitting element 120 in the (N+1)-th row may flow through the sixth transistor T6 of the first sub-pixel SP1(N+1) in the (N+1)-th row. It is to be noted that although FIGS. 5 to 8B shows the repair process of the first sub-pixels as an example, the present disclose is not limited thereto, and the repair process of other sub-pixels SP2 to SP4 may also be performed similar to that of the first sub-pixel.

In addition, although embodiments shown in FIGS. 2 to 8B illustrate that the source electrode of the driving transistor T6 is connected to the cathode of the light emitting element, but the present disclosure is not limited thereto. For example, when the driving transistor T6 is a N-type transistor, the source electrode of the driving transistor T6 may be connected to the anode of the light emitting element, and thus an electrode of the light emitting element connected to the source electrode of the driving transistor T6 may be referred to as the first electrode. The embodiments are described by assuming the light emitting element as the LED or micro-LED as an example, but the present disclosure is not limited thereto, and the present disclosure may also be applied to an organic light emitting diode (OLED) as the light emitting element.

Accordingly, in the display device 100 according to an embodiment of the present disclosure, the welding process is performed on the third capacitor C3 connected between the sixth gate electrode GE6 and the sixth source electrode SE6 of the sixth transistor T6, so that the pixel circuit PC of the defective sub-pixel SP may not work and a bright spot defect in which the light emitting element 120 continuously emits light caused by a defective pixel circuit PC may be prevented. The third capacitor C3 is connected between the sixth gate electrode GE6 and the sixth source electrode SE6 of the sixth transistor T6 that functions as a driving transistor. The third capacitor C3 may reduce a transfer rate of a data voltage when the display device 100 is driven through coupling with the first capacitor C1, so that a delicate grayscale expression may be enabled. Meanwhile, when the pixel circuit PC is defective, a welding process may be performed on the third capacitor C3 to prevent a bright spot defect caused by a defective pixel circuit PC. When the laser LA is irradiated onto the third capacitor C3, the electrodes constituting the third capacitor C3 may contact each other and the sixth gate electrode GE6 and the sixth source electrode SE6 may be electrically connected to each other. In this case, the voltage Vgs between the sixth gate electrode GE6 and the sixth source electrode SE6 becomes 0V, so that the light emitting element 120 may no longer emit light through the corresponding pixel circuit PC. Accordingly, in the display device 100 according to an embodiment of the present disclosure, a defective pixel circuit PC can be easily prevented from abnormal driving by performing a welding process only on the third capacitor C3 without a complicated laser cutting and welding process.

In the display device 100 according to an embodiment of the present disclosure, the reflector RF of the defective sub-pixel SP and the reflector RF of the normal sub-pixel SP adjacent to the defective sub-pixel SP are connected through a welding process, so that the light emitting element 120 of the defective sub-pixel SP may be driven by the pixel circuit PC of the normal sub-pixel SP. First, in each of the plurality of sub-pixels SP, the reflectors RF that cover a majority of areas of the plurality of sub-pixels SP and reflect the light emitted from the light emitting elements 120 upwardly of the substrate 110 are disposed. In this case, the reflector RF functions as an intermediate medium connected between the cathode 125 of the light emitting element 120 and the pixel circuit PC. If a defect occurs in a specific sub-pixel SP, a welding process is performed on the third capacitor C3 to darken or blacken the pixel circuit PC, and then, the light emitting element 120 of the defective sub-pixel SP and the pixel circuit PC of the sub-pixel SP adjacent thereto are electrically connected using the reflector RF, so that the light emitting element 120 of the defective sub-pixel SP can be driven. Specifically, the reflector RF of one sub-pixel SP among a pair of adjacent sub-pixels SP is connected to the first connection pattern CP1, and the reflector RF of the other sub-pixel SP is connected to the second connection pattern CP2. In this case, the first connection pattern CP1 and the second connection pattern CP2 may be disposed to overlap each other with an insulating layer interposed therebetween. If all of the pair of sub-pixels SP are normal sub-pixels SP, the first connection pattern CP1 and the second connection pattern CP2 may maintain a state in which they are spaced apart with the insulating layer interposed therebetween, and the reflectors RF of each of the pair of sub-pixels SP may be electrically insulated from each other. On the other hand, when a defect occurs in one sub-pixel SP among the pair of sub-pixels SP, the laser LA is irradiated onto an overlap point of the first connection pattern CP1 and the second connection pattern CP2, so that the first connection pattern CP1 and the second connection pattern CP2 may be connected to each other. Accordingly, the cathode 125 of the light emitting element 120 of the defective sub-pixel SP may be electrically connected to the cathode 125 of the light emitting element 120 of the normal sub-pixel SP through the first connection pattern CP1, the second connection pattern CP2, and the reflector RF that are connected to one another, and the light emitting element 120 of the defective sub-pixel SP and the light emitting element 120 of the normal sub-pixel SP may be driven in parallel by one pixel circuit PC. That is, the one pixel circuit PC of the normal sub-pixel SP is shared by both the light emitting element 120 of the defective sub-pixel SP and the light emitting element 120 of the normal sub-pixel SP. Accordingly, in the display device 100 according to an embodiment of the present disclosure, the light emitting element 120 of the defective sub-pixel SP is connected to the pixel circuit PC of the sub-pixel SP adjacent thereto by using the reflector RF without further disposing a separate structure, so that a structure of the display device 100 can be simplified. In addition, in the display device 100 according to an embodiment of the present disclosure, the light emitting element 120 of the defective sub-pixel SP can be easily connected to the pixel circuit PC that normally drives through only one welding process using the reflector RF, so that a repair process can be simplified.

The embodiments of the present disclosure can also be described as follows:

According to an aspect of the present disclosure, there is provided a display device. The display device includes a substrate on which a plurality of sub-pixels including at least one defective sub-pixel are defined, a light emitting element disposed in each of the plurality of sub-pixels, a driving transistor disposed in each of the plurality of sub-pixels and having a source electrode connected to a cathode of the light emitting element, a capacitor disposed in each of the plurality of sub-pixels and connected between a gate electrode and the source electrode of the driving transistor, and a reflector disposed in each of the plurality of sub-pixels and electrically connected to the cathode. In the defective sub-pixel, the gate electrode and the source electrode of the driving transistor are electrically connected through the capacitor.

The capacitor may include a plurality of capacitor electrodes. A part of the plurality of capacitor electrodes may be electrically connected to the gate electrode of the driving transistor, and a remaining part of the plurality of capacitor electrodes may be electrically connected to the source electrode of the driving transistor.

The plurality of sub-pixels may include a normal sub-pixel. In the normal sub-pixel, the part and the remaining part of the plurality of capacitor electrodes may be spaced apart from each other with an insulating layer interposed therebetween.

In the defective sub-pixel, the part and the remaining part of the plurality of capacitor electrodes may contact each other.

The plurality of sub-pixels may include a pair of normal sub-pixels adjacent to each other. The reflectors of each of the pair of normal sub-pixels may be electrically insulated from each other.

The reflector of the defective sub-pixel may be electrically connected to the reflector of the normal sub-pixel adjacent to the defective sub-pixel.

The light emitting element of the defective sub-pixel may be electrically connected to the driving transistor of the adjacent normal sub-pixel.

According to another aspect of the present disclosure, there is provided a display device. The display device includes a substrate on which a defective sub-pixel and a normal sub-pixel adjacent to the defective sub-pixel are defined, a light emitting element disposed in each of the defective sub-pixel and the normal sub-pixel, a driving transistor disposed in each of the defective sub-pixel and the normal sub-pixel and including a source electrode electrically connected to a cathode of the light emitting element, a capacitor disposed in each of the defective sub-pixel and the normal sub-pixel and including a plurality of capacitor electrodes that are connected to each of a gate electrode and the source electrode of the driving transistor, and a reflector disposed between the driving transistor and the light emitting element and electrically connected to the cathode in each of the defective sub-pixel and the normal sub-pixel. The reflector of the defective sub-pixel and the reflector of the normal sub-pixel are electrically connected.

The plurality of capacitor electrodes may include a lower capacitor electrode disposed on the substrate and electrically connected to the source electrode, an intermediate capacitor electrode disposed on the lower capacitor electrode and electrically connected to the gate electrode, and an upper capacitor electrode disposed on the intermediate capacitor electrode and electrically connected to the source electrode. The display device may further include a plurality of insulating layers disposed between the lower capacitor electrode and the intermediate capacitor electrode and between the intermediate capacitor electrode and the upper capacitor electrode.

In the defective sub-pixel, the plurality of insulating layers may be opened, so that the lower capacitor electrode, the intermediate capacitor electrode, and the upper capacitor electrode may contact each other.

In the normal sub-pixel, the lower capacitor electrode, the intermediate capacitor electrode, and the upper capacitor electrode may be spaced apart from one another by the plurality of insulating layers.

The display device may further include a first connection pattern electrically connected to the reflector of the defective sub-pixel, a second connection pattern electrically connected to the reflector of the normal sub-pixel, extending toward the first connection pattern and partially overlapping the first connection pattern, and an insulating layer between the first connection pattern and the second connection pattern. The insulating layer may be opened so that the first connection pattern and the second connection pattern may contact each other.

The cathode of the defective sub-pixel may be electrically connected to the cathode of the normal sub-pixel through the reflector of the defective sub-pixel, the first connection pattern, the second connection pattern, and the reflector of the normal sub-pixel.

The light emitting element of the defective sub-pixel and the light emitting element of the normal sub-pixel may be driven by a driving current flowing through the driving transistor of the normal sub-pixel.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate on which a plurality of sub-pixels including at least one defective sub-pixel are defined;
a light emitting element disposed in each of the plurality of sub-pixels;
a driving transistor disposed in each of the plurality of sub-pixels and having a source electrode connected to a first electrode of the light emitting element;
a capacitor disposed in each of the plurality of sub-pixels and connected between a gate electrode and the source electrode of the driving transistor; and
a reflector disposed in each of the plurality of sub-pixels and electrically connected to the first electrode,
wherein in the at least one defective sub-pixel, the gate electrode and the source electrode of the driving transistor are electrically connected through the capacitor, and
wherein, in the at least one defective sub-pixel, the gate electrode and the source electrode of the driving transistor are short-circuited by the capacitor, and a voltage between the gate electrode and the source electrode of the driving transistor is 0 V.

2. The display device of claim 1, wherein the first electrode of the light emitting element is a cathode of the light emitting element.

3. The display device of claim 1, wherein the light emitting element is a light emitting diode (LED) or a micro-LED.

4. The display device of claim 1, wherein the reflector is disposed in a region corresponding to a region occupied by each of the plurality of sub-pixels.

5. The display device of claim 1, wherein the capacitor includes a plurality of capacitor electrodes,
wherein a part of the plurality of capacitor electrodes is electrically connected to the gate electrode of the driving transistor, and
a remaining part of the plurality of capacitor electrodes is electrically connected to the source electrode of the driving transistor.

6. The display device of claim 5, wherein the plurality of sub-pixels include a normal sub-pixel,
wherein in the normal sub-pixel, the part and the remaining part of the plurality of capacitor electrodes are spaced apart from each other with an insulating layer interposed therebetween.

7. The display device of claim 5, wherein in the at least one defective sub-pixel, the part and the remaining part of the plurality of capacitor electrodes contact each other.

8. The display device of claim 1, wherein the plurality of sub-pixels include a pair of normal sub-pixels adjacent to each other,
wherein the reflectors of each of the pair of normal sub-pixels are electrically insulated from each other.

9. The display device of claim 8, wherein the reflector of the defective sub-pixel is electrically connected to the reflector of one of the pair of normal sub-pixels adjacent to the at least one defective sub-pixel.

10. The display device of claim 9, wherein the light emitting element of the at least one defective sub-pixel is electrically connected to the driving transistor of the adjacent one of the pair of normal sub-pixels.

11. A display device, comprising:
a substrate on which a defective sub-pixel and a normal sub-pixel adjacent to the defective sub-pixel are defined;

a light emitting element disposed in each of the defective sub-pixel and the normal sub-pixel;
a driving transistor disposed in each of the defective sub-pixel and the normal sub-pixel and including a source electrode electrically connected to a first electrode of the light emitting element;
a capacitor disposed in each of the defective sub-pixel and the normal sub-pixel and including a plurality of capacitor electrodes that are connected to each of a gate electrode and the source electrode of the driving transistor; and
a reflector disposed between the driving transistor and the light emitting element and electrically connected to the first electrode in each of the defective sub-pixel and the normal sub-pixel,
wherein the reflector of the defective sub-pixel and the reflector of the normal sub-pixel are electrically connected, and
wherein, in the defective sub-pixel, the gate electrode and the source electrode of the driving transistor are short-circuited by the capacitor, and a voltage between the gate electrode and the source electrode of the driving transistor is 0 V.

12. The display device of claim 11, wherein the first electrode of the light emitting element is a cathode of the light emitting element.

13. The display device of claim 11, wherein the light emitting element is a light emitting diode (LED) or a micro-LED.

14. The display device of claim 11, wherein the reflector is disposed in a region corresponding to a region occupied by each of the defective sub-pixel and the normal sub-pixel.

15. The display device of claim 11, wherein the plurality of capacitor electrodes include:
a lower capacitor electrode disposed on the substrate and electrically connected to the source electrode;
an intermediate capacitor electrode disposed on the lower capacitor electrode and electrically connected to the gate electrode; and
an upper capacitor electrode disposed on the intermediate capacitor electrode and electrically connected to the source electrode, and
wherein the display device further includes a plurality of insulating layers disposed between the lower capacitor electrode and the intermediate capacitor electrode and between the intermediate capacitor electrode and the upper capacitor electrode.

16. The display device of claim 15, wherein in the defective sub-pixel, the plurality of insulating layers are opened, so that the lower capacitor electrode, the intermediate capacitor electrode, and the upper capacitor electrode contact each other.

17. The display device of claim 15, wherein in the normal sub-pixel, the lower capacitor electrode, the intermediate capacitor electrode, and the upper capacitor electrode are spaced apart from one another by the plurality of insulating layers.

18. The display device of claim 11, further comprising:
a first connection pattern electrically connected to the reflector of the defective sub-pixel;
a second connection pattern electrically connected to the reflector of the normal sub-pixel, extending toward the first connection pattern and partially overlapping the first connection pattern; and
an insulating layer between the first connection pattern and the second connection pattern, wherein the insulating layer is opened so that the first connection pattern and the second connection pattern contact each other.

19. The display device of claim 18, wherein the first electrode of the defective sub-pixel is electrically connected to the first electrode of the normal sub-pixel through the reflector of the defective sub-pixel, the first connection pattern, the second connection pattern, and the reflector of the normal sub-pixel.

20. The display device of claim 12, wherein the light emitting element of the defective sub-pixel and the light emitting element of the normal sub-pixel are driven by a driving current flowing through the driving transistor of the normal sub-pixel.

* * * * *